(12) United States Patent
Mehandru et al.

(10) Patent No.: US 11,522,072 B2
(45) Date of Patent: Dec. 6, 2022

(54) VERTICAL INTEGRATION SCHEME AND CIRCUIT ELEMENTS ARCHITECTURE FOR AREA SCALING OF SEMICONDUCTOR DEVICES

(71) Applicant: Intel Corporation, Santa Clara, CA (US)

(72) Inventors: Rishabh Mehandru, Portland, OR (US); Patrick Morrow, Portland, OR (US); Ranjith Kumar, Beaverton, OR (US); Cory E. Weber, Hillsboro, OR (US); Seiyon Kim, Portland, OR (US); Stephen M. Cea, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 27 days.

(21) Appl. No.: 17/080,458

(22) Filed: Oct. 26, 2020

(65) Prior Publication Data

US 2021/0043755 A1 Feb. 11, 2021

Related U.S. Application Data

(60) Division of application No. 16/396,088, filed on Apr. 26, 2019, now Pat. No. 10,847,635, which is a
(Continued)

(51) Int. Cl.
*H01L 29/45* (2006.01)
*H01L 29/16* (2006.01)
(Continued)

(52) U.S. Cl.
CPC .... *H01L 29/66795* (2013.01); *H01L 21/8221* (2013.01); *H01L 21/823431* (2013.01);
(Continued)

(58) Field of Classification Search
None
See application file for complete search history.

(56) References Cited

U.S. PATENT DOCUMENTS 7,368,788 B2 5/2008 Huo
7,495,285 B2 2/2009 Lee
(Continued)

FOREIGN PATENT DOCUMENTS

JP 2005-012213 1/2005
KR 10-0645065 11/2006

OTHER PUBLICATIONS

International Search Report and Written Opinion for PCT Patent Application No. PCT/US2015/036286 dated Feb. 26, 2016, 10 pgs.
(Continued)

*Primary Examiner* — Joseph C. Nicely
*Assistant Examiner* — Lamont B Koo
(74) *Attorney, Agent, or Firm* — Schwabe, Williamson & Wyatt, P.C.

(57) ABSTRACT

Vertical integration schemes and circuit elements architectures for area scaling of semiconductor devices are described. In an example, an inverter structure includes a semiconductor fin separated vertically into an upper region and a lower region. A first plurality of gate structures is included for controlling the upper region of the semiconductor fin. A second plurality of gate structures is included for controlling the lower region of the semiconductor fin. The second plurality of gate structures has a conductivity type opposite the conductivity type of the first plurality of gate structures.

23 Claims, 30 Drawing Sheets

Related U.S. Application Data continuation of application No. 15/570,965, filed as application No. PCT/US2015/036286 on Jun. 17, 2015, now Pat. No. 10,304,946.

(51) Int. Cl.

| | |
|---|---|
| *H01L 29/66* | (2006.01) |
| *H01L 29/78* | (2006.01) |
| *H01L 21/822* | (2006.01) |
| *H01L 21/8238* | (2006.01) |
| *H01L 27/06* | (2006.01) |
| *H01L 27/11* | (2006.01) |
| *H01L 21/8234* | (2006.01) |
| *H01L 21/84* | (2006.01) |
| *H01L 27/108* | (2006.01) |
| *H01L 27/12* | (2006.01) |
| *H01L 29/778* | (2006.01) |

(52) U.S. Cl.
CPC .... *H01L 21/823821* (2013.01); *H01L 21/845* (2013.01); *H01L 27/0688* (2013.01); *H01L 27/10826* (2013.01); *H01L 27/1104* (2013.01); *H01L 27/1211* (2013.01); *H01L 29/78* (2013.01); *H01L 29/785* (2013.01); *H01L 29/7782* (2013.01)

(56) References Cited

U.S. PATENT DOCUMENTS

| | | | |
|---|---|---|---|
| 7,745,270 | B2 | 6/2010 | Shah |
| 9,048,303 | B1 | 6/2015 | Ostermaier |
| 9,601,617 | B2 | 3/2017 | Yuan |
| 10,304,946 | B2 | 5/2019 | Mehandru |
| 2002/0096689 | A1 | 7/2002 | Nemati et al. |
| 2004/0113207 | A1 | 6/2004 | Hsu et al. |
| 2004/0256639 | A1 | 12/2004 | Quyang et al. |
| 2006/0220134 | A1 | 10/2006 | Huo et al. |
| 2007/0069280 | A1 | 3/2007 | Kim |
| 2012/0126883 | A1 | 5/2012 | Juengling |
| 2013/0015500 | A1 | 1/2013 | Izumida et al. |
| 2013/0095623 | A1 | 4/2013 | Guo |
| 2013/0320434 | A1* | 12/2013 | Shin ............ H01L 29/165 257/329 |
| 2014/0035041 | A1 | 2/2014 | Pillarisetty et al. |
| 2015/0108573 | A1 | 4/2015 | Liu et al. |
| 2015/0155208 | A1 | 6/2015 | Mor et al. |
| 2016/0056290 | A1* | 2/2016 | Tsai ............ H01L 29/66636 257/192 |

OTHER PUBLICATIONS

Search Report for European Patent Application No. 15895802.5 dated Dec. 19, 2018, 12 pgs.

International Preliminary Report on Patentability for PCT Patent Application No. PCT/US2015/036286 dated Dec. 19, 2017, 6 pgs.

Office Action for Taiwan Patent Application No. 105114453, dated Sep. 17, 2019, 9 pgs.

Office Action for Chinese Patent Application No. 201580080106.X dated Jul. 7, 2020, 8 pgs., no translation.

Notice of Allowance for Chinese Patent Application No. 201580080106.X dated Jan. 8, 2021, 4 pgs., with English translation.

Office Action from Korean Patent Application No. 10-2017-7032875, dated Apr. 30, 2021, 4 pgs.

Office Action from Korean Patent Application No. 10-2017-7032875, dated May 24, 2021, 8 pgs.

Office Action from Korean Patent Application No. 10-2017-7032875, dated Jan. 27, 2022, 3 pgs.

Office Action from Korean Patent Application No. 10-2017-7032875, dated Nov. 30, 2021, 4 pgs.

* cited by examiner

VERTICAL INTEGRATION SCHEME AND CIRCUIT ELEMENTS ARCHITECTURE FOR AREA SCALING OF SEMICONDUCTOR DEVICES

CROSS-REFERENCE TO RELATED APPLICATION

This patent application is a divisional of U.S. patent application Ser. No. 16/396,088, filed Apr. 26, 2019, which is a continuation of U.S. patent application Ser. No. 15/570,965, filed Oct. 31, 2017, now U.S. Pat. No. 10,304,946, issued May 28, 2019, which is a U.S. National Phase Application under 35 U.S.C. § 371 of International Application No. PCT/US2015/036286, filed Jun. 17, 2015, entitled "VERTICAL INTEGRATION SCHEME AND CIRCUIT ELEMENTS ARCHITECTURE FOR AREA SCALING OF SEMICONDUCTOR DEVICES," which designates the United States of America, the entire disclosure of which are hereby incorporated by reference in their entirety and for all purposes.

TECHNICAL FIELD

Embodiments of the invention are in the field of semiconductor devices and processing and, in particular, vertical integration schemes and circuit elements architectures for area scaling of semiconductor devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

DESCRIPTION OF THE EMBODIMENTS

Vertical integration schemes and circuit elements architectures for area scaling of semiconductor devices are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to a vertical integration scheme and circuit elements architecture for 2× area scaling for reduced layout usage. In an embodiment, an entire circuit element is fabricated based on a single semiconductor fin, as opposed to fabricating one transistor per fin which is then tied into a circuit element. Some of the circuit elements described herein are built within the framework of a boxed in device, such as a framework based on gate edge structures (e.g., as gate isolation regions) of gate electrodes of the semiconductor structures or devices. In one or more embodiments, devices described herein are fabricated for SRAM or like architectures based on complementary metal oxide semiconductor (CMOS) devices.

To provide context, increasing transistor density helps increase the number of transistors per chip or number of chips per wafer. It is becoming very difficult to scale transistor pitch. One or more embodiments described herein enable significant chip area scaling or transistor density increase (2×) by vertically integrating transistors to manufacture circuit elements (e.g., inverters/NAND/NOR/AND/OR gates and SRAM cells). For stacking two device layers, architectures described herein have advantages over sequential device fabrication. First, the most expensive front end patterning layers (e.g., poly and fin) do not need to be performed twice. Second, if metal interconnect layers between devices are not required, such an architecture locates the devices much closer to one another. In one embodiment, a very compact CMOS elementary circuit is achieved.

Figure 1:
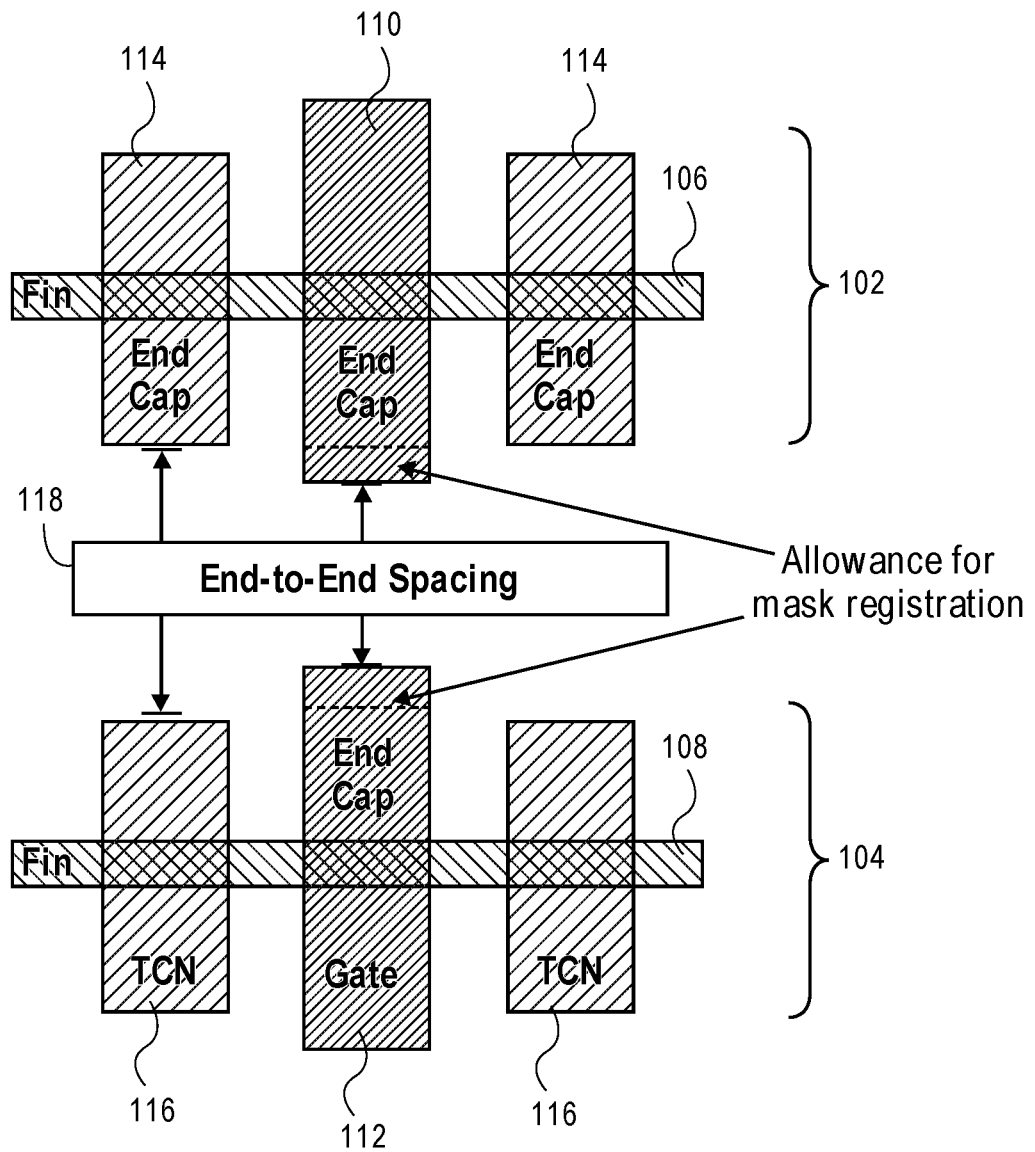
FIG. 1 illustrates a plan view of a layout including fin-based semiconductor devices accommodating end-to-end spacing, in accordance with the prior art.

To provide further context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, FIG. 1 illustrates a plan view of a layout 100 including fin-based semiconductor devices accommodating end-to-end spacing, in accordance with the prior art. Referring to FIG. 1, first 102 and second 104 semiconductor devices are based on semiconductor fins 106 and 108, respectively. Each device 102 and 104 has a gate electrode 110 or 112, respectively. Additionally, each device 102 and 104 has trench contacts (TCNs) 114 and 116, respectively, at source and drain regions of the fins 106 and 108, respectively. The gate electrodes 110 and 112 and the TCNs 114 and 116 each have an end cap region, which is located off of the corresponding fins 106 and 108, respectively.

Referring again to FIG. 1, typically, gate and TCN endcap dimensions must include an allowance for mask registration error to ensure robust transistor operation for worst case mask mis-registration, leaving an end-to-end spacing 118. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present invention, approaches are described which provide for self-aligned gate endcap (SAGE) and TCN overlap of a semiconductor fin without any need to allow for mask registration. Although not so limited, one or more embodiments may be implemented within a SAGE framework, which is an example of a boxed in approach. In an embodiment, circuit elements are fabricated in each fin instead of just one transistor being fabricated in a single fin. With or without a further size controlling framework such as SAGE, one or more embodiments described herein involve fabrication of an entire circuit element based on single fin.

Figure 2A:
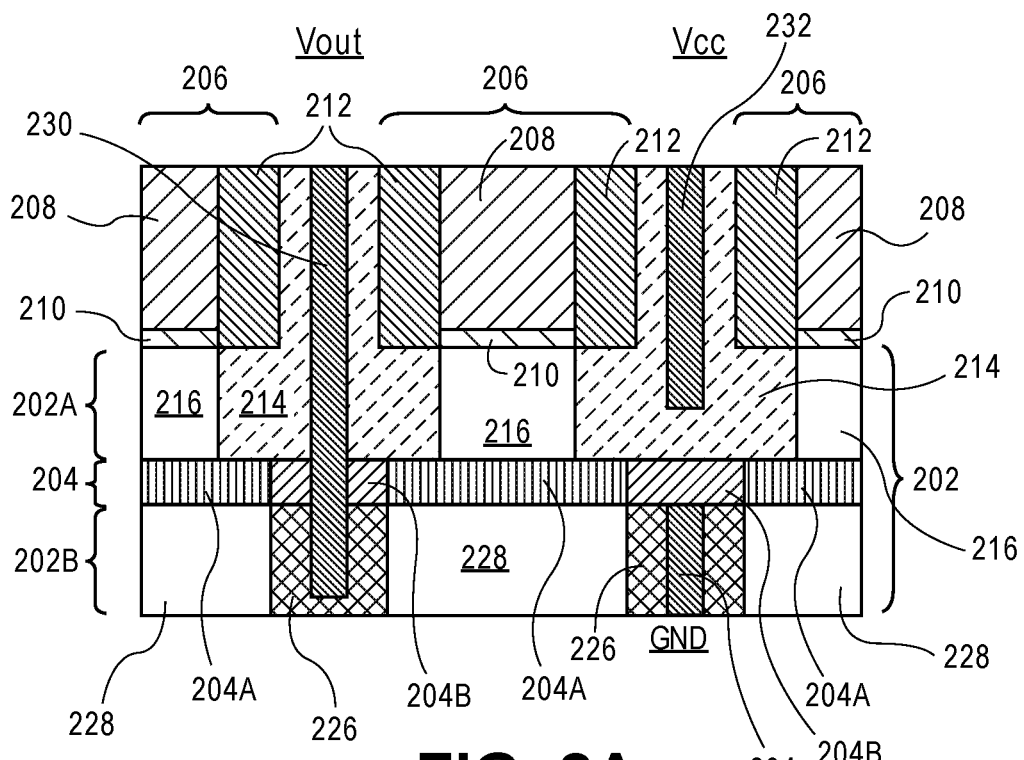
FIGS. 2A and 2B illustrate cross-sectional views of an inverter circuit element fabricated using a single semiconductor fin structure, in accordance with an embodiment of the present invention.
Figure 2B:
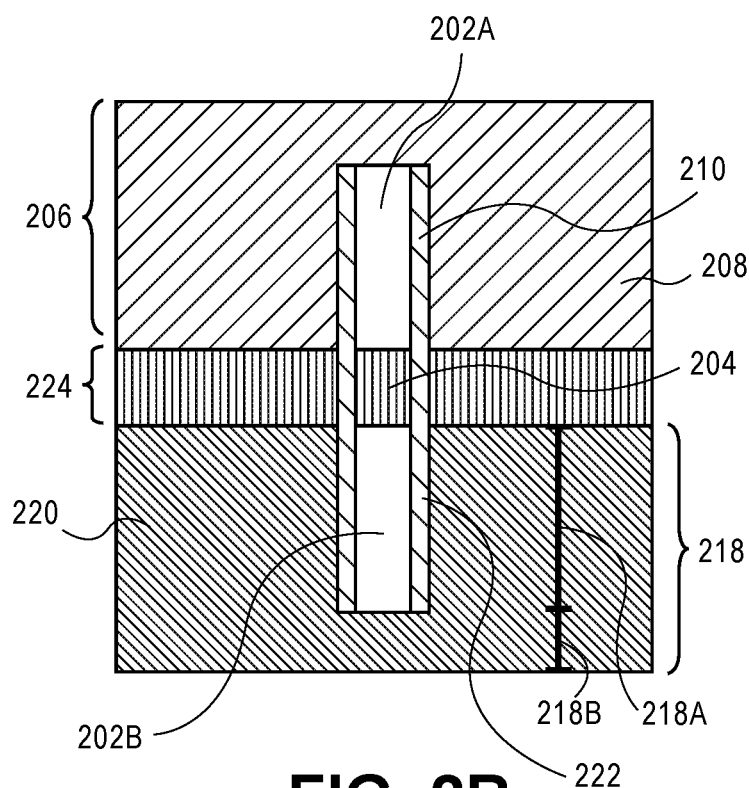

In a first example of a circuit element that may be fabricated using a single fin, FIGS. 2A and 2B illustrate cross-sectional views of an inverter circuit element fabricated using a single semiconductor fin structure, in accordance with an embodiment of the present invention. FIG. 2A is a cross-sectional view taken through the gate structures and along the fin structure. FIG. 2B is a cross-sectional view taken through the fin structure and along the gate structures.

Referring to FIG. 2A, a semiconductor fin 202 can be viewed as being separated vertically into an upper region 202A and a lower region 202B. In one embodiment, the upper region 202A and the lower region 202B of the semiconductor fin 202 are separated by an insulating layer 204, such as a silicon oxide layer or other insulating oxide layer or a silicon nitride layer. The insulating layer 204 may include regions 204A and 204B of differing insulating material, depending on the integration scheme used to fabricate the structure, examples of which are described in greater detail below.

A first plurality of gate structures 206, such as PMOS gate structures, is included above the upper region 202A of the semiconductor fin 202. Each of the first plurality of gate structures 206 can include a gate electrode 208, a gate dielectric layer 210 and associated dielectric spacers 212. It is to be appreciated that the first plurality of gate structures 206 extends from the top of the upper region 202A of the semiconductor fin 202 (as shown) and further wraps the upper region 202A of the semiconductor fin 202 at locations into and out of the page with respect to the perspective shown in FIG. 2A. The upper region 202A of the semiconductor fin 202 may, in an embodiment, further include regrown source or drain regions. In an exemplary embodiment, the upper region 202A of the semiconductor fin 202 further includes epitaxial P-type silicon germanium regions 214, leaving remaining semiconductor regions (such as silicon regions) 216 of the upper region 202A of the semiconductor fin 202.

Although not depicted in FIG. 2A, but is shown in FIG. 2B, the lower region 202B of the semiconductor fin 202 is associated with a second plurality of gate structures 218, such as NMOS gate structures. Each of the second plurality of gate structures 218 can include a gate electrode 220, a gate dielectric layer 222 and associated dielectric spacers. It is to be appreciated that the second plurality of gate structures 218 wraps the lower region 202B of the semiconductor fin 202 at locations into and out of the page with respect to the perspective shown in FIG. 2A and, thus, can only be seen in the cross-sectional view of FIG. 2B, i.e., at regions 218A. As shown in FIG. 2B, in a specific embodiment where the semiconductor structure is a nanowire structure, each of the second plurality of gate structures 218 further wraps below the lower region 202B of the semiconductor fin 202 at locations 218B. However, in another embodiment, in the case of a fin structure that is a bulk fin structure or is otherwise coupled to an underlying substrate, portions 218B of each of the second plurality of gate structures 218 are not included, such that a tri-gate like structure is formed.

Referring again to FIG. 2A, in an embodiment, the lower region 202B of the semiconductor fin 202 may further include regrown source or drain regions. In an exemplary embodiment, the lower region 202B of the semiconductor fin 202 further includes epitaxial N-type silicon regions 226, leaving remaining semiconductor regions (such as silicon regions) 228 of the lower region 202B of the semiconductor fin 202.

In an embodiment, each of the first plurality of gate structures 206 is formed in a same trench as a corresponding one of the second plurality of gate structures 218, but vertically above the corresponding one of the second plurality of gate structures 218. In one such embodiment, each of the first plurality of gate structures 206 is isolated from the corresponding one of the second plurality of gate structures 218 by an insulating layer 224, as is depicted in FIG. 2B. However, in another embodiment, each of the first plurality of gate structures 206 forms a P/N junction with the corresponding one of the second plurality of gate structures 218 to effectively connect or short together certain of the gate pairings.

Referring again to FIGS. 2A and 2B, in an embodiment, wiring considerations such as backside wiring and wiring stacked between layers of semiconductor devices must be accounted for to bring the devices of the single fin together to form a circuit element. In one such embodiment, a first conductive contact 230 contacts a first upper region 214 and a first lower region 226 to form a Vout contact. A second conductive contact 232 contacts a second upper region 214 to form a Vcc contact. Finally, a third conductive contact 234 contacts a second lower region 226 to form a contact to ground (GND).

Referring again to FIGS. 2A and 2B, an entire inverter structure is fabricated on a single fin 202. That is, an entire circuit element is fabricated on a single semiconductor fin. It is to be appreciated that in order to use such an inverter to fabricate an SRAM cell, two such inverters can be coupled with two pass gates. In accordance with an embodiment of the present invention, each such pass gate is also fabricated on a single fin.

Figure 3A:
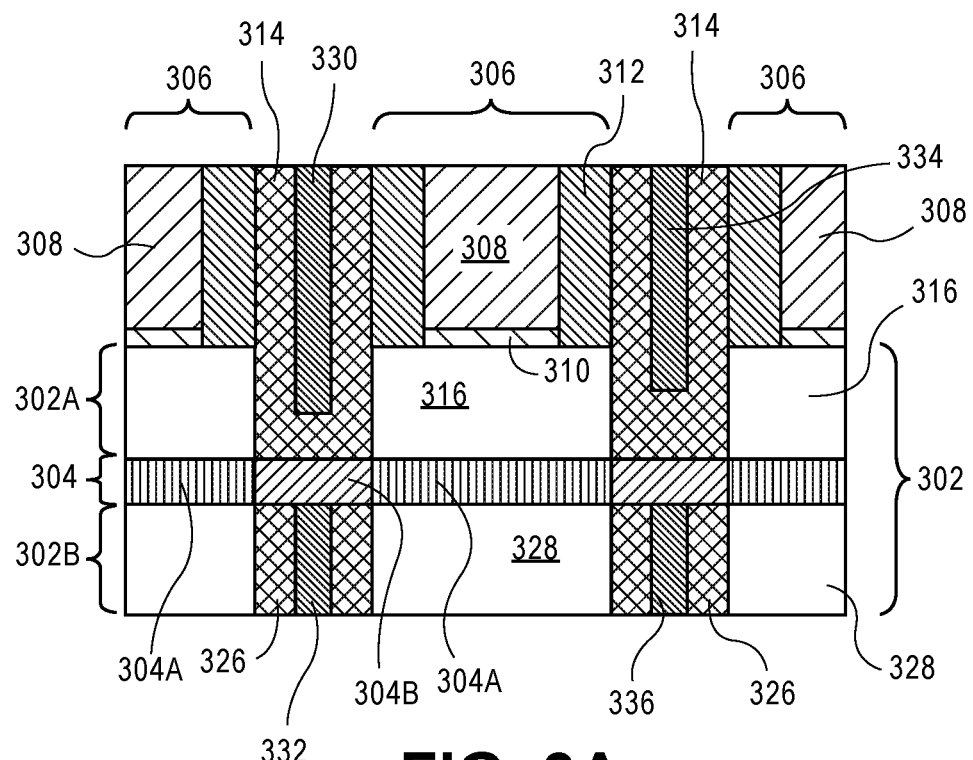
FIGS. 3A and 3B illustrate cross-sectional views of a pass gate circuit element fabricated using a single semiconductor fin structure, in accordance with an embodiment of the present invention.
Figure 3B:
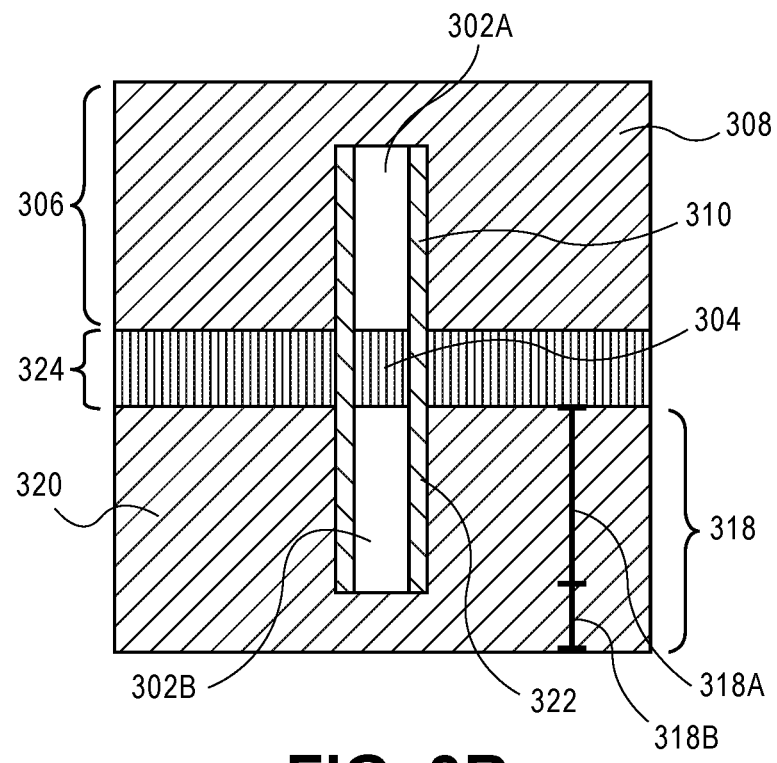

In a second example of a circuit element that may be fabricated using a single fin, FIGS. 3A and 3B illustrate cross-sectional views of a pass gate circuit element fabricated using a single semiconductor fin structure, in accordance with an embodiment of the present invention. FIG. 3A is a cross-sectional view taken through the gate structures and along the fin structure. FIG. 3B is a cross-sectional view taken through the fin structure and along the gate structures.

Referring to FIG. 3A, a semiconductor fin 302 can be viewed as being separated vertically into an upper region 302A and a lower region 302B. In one embodiment, the upper region 302A and the lower region 302B of the semiconductor fin 302 are separated by an insulating layer 304, such as a silicon oxide layer or other insulating oxide layer or a silicon nitride layer. The insulating layer 304 may include regions 304A and 304B of differing insulating material, depending on the integration scheme used to fabricate the structure, examples of which are described in greater detail below.

A first plurality of gate structures 306, such as NMOS gate structures, is included above the upper region 302A of the semiconductor fin 302. Each of the first plurality of gate structures 306 can include a gate electrode 308, a gate dielectric layer 310 and associated dielectric spacers 312. It is to be appreciated that the first plurality of gate structures 306 extends from the top of the upper region 302A of the semiconductor fin 302 (as shown) and further wraps the upper region 302A of the semiconductor fin 302 at locations into and out of the page with respect to the perspective shown in FIG. 3A. The upper region 302A of the semiconductor fin 302 may, in an embodiment, further include regrown source or drain regions. In an exemplary embodiment, the upper region 302A of the semiconductor fin 302 further includes first epitaxial N-type silicon regions 314, leaving remaining semiconductor regions (such as silicon regions) 316 of the upper region 302A of the semiconductor fin 302.

Although not depicted in FIG. 3A, but is shown in FIG. 3B, the lower region 302B of the semiconductor fin 302 is associated with a second plurality of gate structures 318, such as a second plurality of NMOS gate structures. Each of the second plurality of gate structures 318 can include a gate electrode 320, a gate dielectric layer 322 and associated dielectric spacers. It is to be appreciated that the second plurality of gate structures 318 wraps the lower region 302B of the semiconductor fin 302 at locations into and out of the page with respect to the perspective shown in FIG. 3A and, thus, can only be seen in the cross-sectional view of FIG. 3B, i.e., at regions 318A. As shown in FIG. 3B, in a specific embodiment where the semiconductor structure is a nanowire structure, each of the second plurality of gate structures 318 further wraps below the lower region 302B of the semiconductor fin 302 at locations 318B. However, in another embodiment, in the case of a fin structure that is a bulk fin structure or is otherwise coupled to an underlying substrate, portions 318B of each of the second plurality of gate structures 318 are not included, such that a tri-gate like structure is formed.

Referring again to FIG. 3A, in an embodiment, the lower region 302B of the semiconductor fin 302 may further include regrown source or drain regions. In an exemplary embodiment, the lower region 302B of the semiconductor fin 302 further includes epitaxial N-type silicon regions 326, leaving remaining semiconductor regions (such as silicon regions) 328 of the lower region 302B of the semiconductor fin 302.

In an embodiment, each of the first plurality of gate structures 306 is formed in a same trench as a corresponding one of the second plurality of gate structures 318, but vertically above the corresponding one of the second plurality of gate structures 318. In one such embodiment, each of the first plurality of gate structures 306 has a same conductivity type (e.g., N-type) and is isolated from the corresponding one of the second plurality of gate structures 318 by an insulating layer 324, as is depicted in FIG. 3B.

Referring again to FIGS. 3A and 3B, in an embodiment, wiring considerations such as backside wiring and wiring stacked between layers of semiconductor devices must be accounted for to bring the devices of the single fin together to form a circuit element. In one such embodiment, a first conductive contact 330 contacts a first upper region 314 to form a connection to a first inverter element. A second conductive contact 332 contacts a first lower region 326 to form a connection to a second inverter element. A third conductive contact 334 contacts a second upper region 314 to form a first bitline contact. Finally, a fourth conductive contact 336 contacts a second lower region 326 to form a second bitline contact. Thus, an entire pass gate structure is fabricated on a single fin 302.

It is to be appreciated that current solutions involve decreasing poly pitch and fin pitch which puts tremendous constraint on process technology to etch/deposit/and perform lithography in ever smaller dimensions. By contrast, embodiments described herein allow transistor density increase without drawn pitch scaling. Embodiments may involve application of such an approach to AND gates (e.g., FIGS. 4A and 4B), OR gates (e.g., FIGS. 5A and 5B), NAND architectures (e.g., FIGS. 6A, 6B, 7A and 7B), NOR architectures (e.g., FIGS. 8A-8D), inverters (e.g., FIGS. 2A and 2B), SRAM cells (e.g., FIGS. 2A, 2B, 3A and 3B) and other random logic components.

Figure 4A:
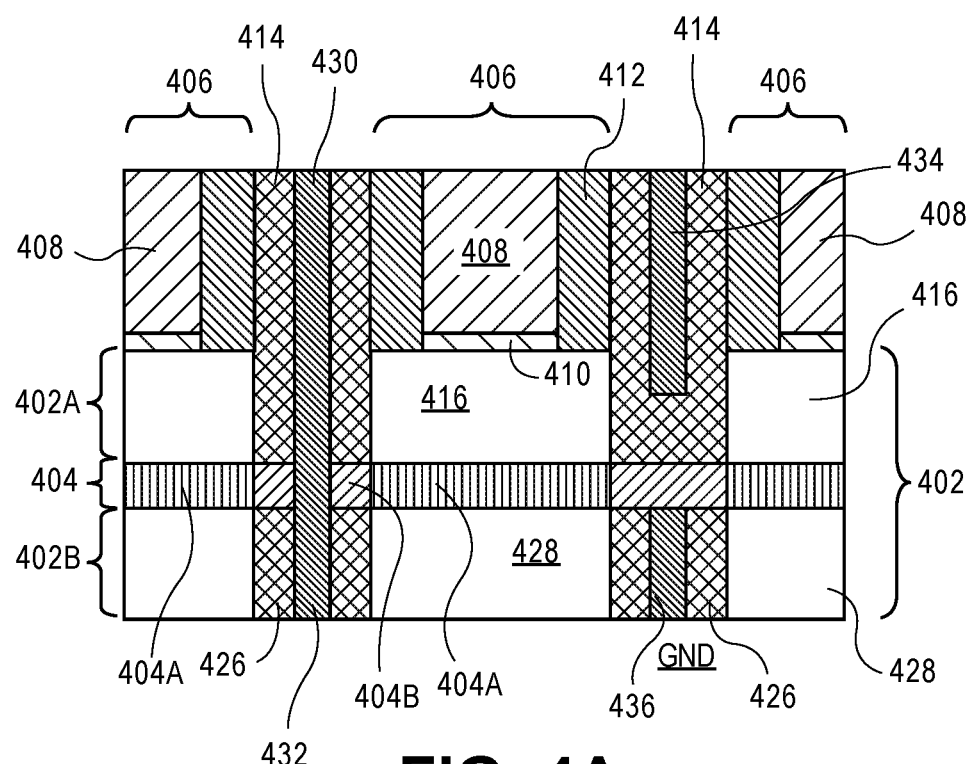
FIGS. 4A and 4B illustrate cross-sectional views of an AND gate circuit element fabricated using a single semiconductor fin structure, in accordance with an embodiment of the present invention.
Figure 4B:
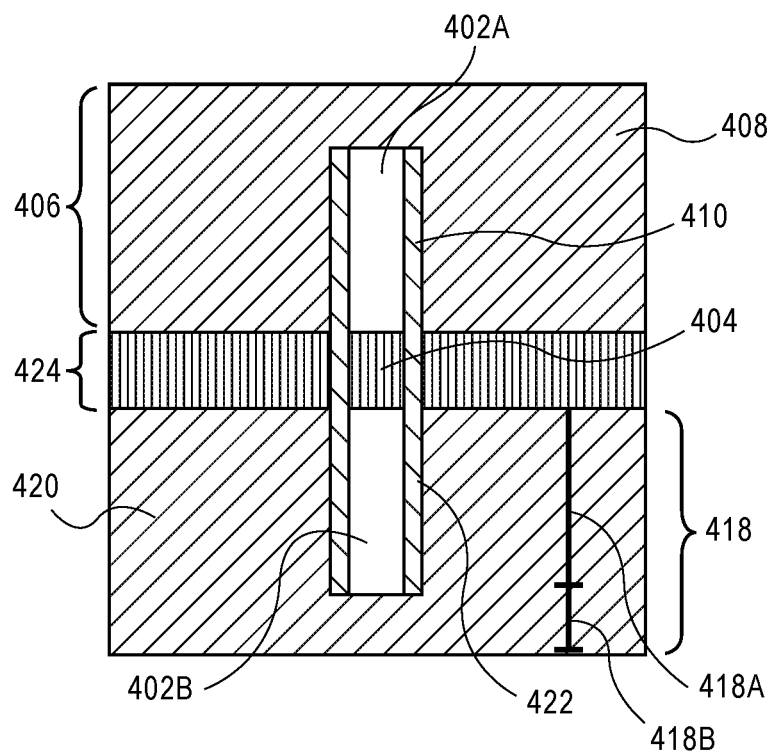

In a third example of a circuit element that may be fabricated using a single fin, FIGS. 4A and 4B illustrate cross-sectional views of an AND gate circuit element fabricated using a single semiconductor fin structure, in accordance with an embodiment of the present invention. FIG. 4A is a cross-sectional view taken through the gate structures and along the fin structure. FIG. 4B is a cross-sectional view taken through the fin structure and along the gate structures.

Referring to FIG. 4A, a semiconductor fin 402 can be viewed as being separated vertically into an upper region 402A and a lower region 402B. In one embodiment, the upper region 402A and the lower region 402B of the semiconductor fin 402 are separated by an insulating layer 404, such as a silicon oxide layer or other insulating oxide layer or a silicon nitride layer. The insulating layer 404 may include regions 404A and 404B of differing insulating material, depending on the integration scheme used to fabricate the structure, examples of which are described in greater detail below.

A first plurality of gate structures 406, such as NMOS gate structures, is included above the upper region 402A of the semiconductor fin 402. Each of the first plurality of gate structures 406 can include a gate electrode 408, a gate dielectric layer 410 and associated dielectric spacers 412. It is to be appreciated that the first plurality of gate structures 406 extends from the top of the upper region 402A of the semiconductor fin 402 (as shown) and further wraps the upper region 402A of the semiconductor fin 402 at locations into and out of the page with respect to the perspective shown in FIG. 4A. The upper region 402A of the semiconductor fin 402 may, in an embodiment, further include regrown source or drain regions. In an exemplary embodiment, the upper region 402A of the semiconductor fin 402 further includes first epitaxial N-type silicon regions 414, leaving remaining semiconductor regions (such as silicon regions) 416 of the upper region 402A of the semiconductor fin 402.

Although not depicted in FIG. 4A, but is shown in FIG. 4B, the lower region 402B of the semiconductor fin 402 is associated with a second plurality of gate structures 418, such as a second plurality of NMOS gate structures. Each of the second plurality of gate structures 418 can include a gate electrode 420, a gate dielectric layer 422 and associated dielectric spacers. It is to be appreciated that the second plurality of gate structures 418 wraps the lower region 402B of the semiconductor fin 402 at locations into and out of the page with respect to the perspective shown in FIG. 4A and, thus, can only be seen in the cross-sectional view of FIG. 4B, i.e., at regions 418A. As shown in FIG. 4B, in a specific embodiment where the semiconductor structure is a nanowire structure, each of the second plurality of gate structures 418 further wraps below the lower region 402B of the semiconductor fin 402 at locations 418B. However, in another embodiment, in the case of a fin structure that is a bulk fin structure or is otherwise coupled to an underlying substrate, portions 418B of each of the second plurality of gate structures 418 are not included, such that a tri-gate like structure is formed.

Referring again to FIG. 4A, in an embodiment, the lower region 402B of the semiconductor fin 402 may further include regrown source or drain regions. In an exemplary embodiment, the lower region 402B of the semiconductor fin 402 further includes epitaxial N-type silicon regions 426, leaving remaining semiconductor regions (such as silicon regions) 428 of the lower region 402B of the semiconductor fin 402.

In an embodiment, each of the first plurality of gate structures 406 is formed in a same trench as a corresponding one of the second plurality of gate structures 418, but vertically above the corresponding one of the second plurality of gate structures 418. In one such embodiment, each of the first plurality of gate structures 406 has a same conductivity type (e.g., N-type) and is isolated from the corresponding one of the second plurality of gate structures 418 by an insulating layer 424, as is depicted in FIG. 4B.

Referring again to FIGS. 4A and 4B, in an embodiment, wiring considerations such as backside wiring and wiring stacked between layers of semiconductor devices must be accounted for to bring the devices of the single fin together to form a circuit element. In one such embodiment, a first conductive contact 430 contacts a first upper region 414 and a first lower region 426 to form a contact. A second conductive contact 432 contacts a second upper region 414 to form an OUT terminal. Finally, a third conductive contact 434 contacts a second lower region 426 to form a contact to ground (GND). Thus, an entire AND gate structure is fabricated on a single fin 402.

Figure 5A:
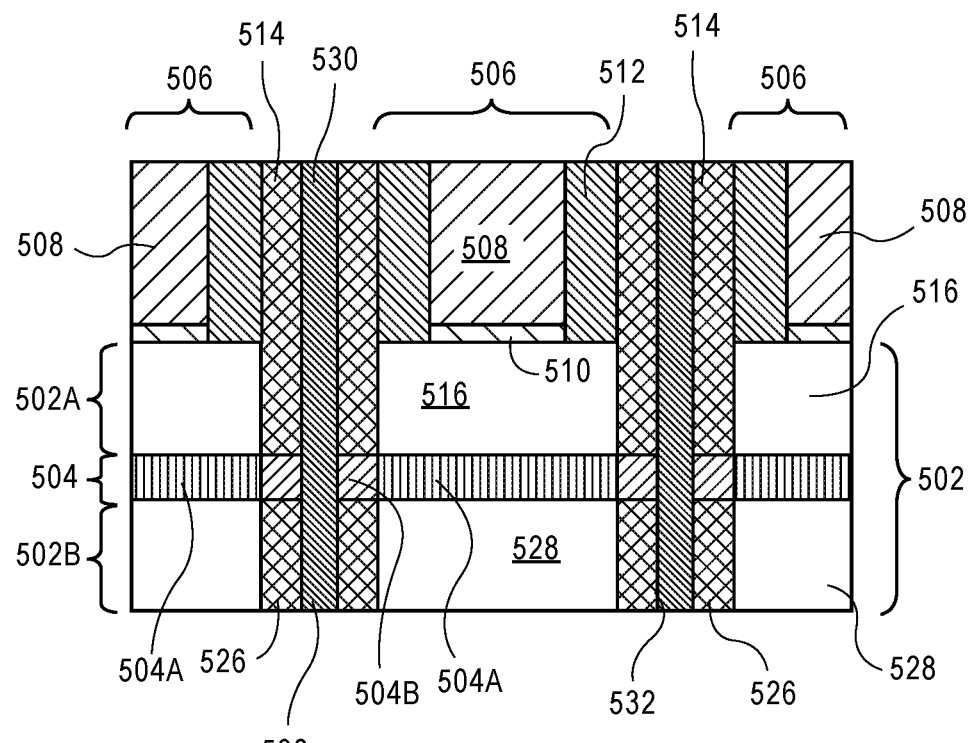
FIGS. 5A and 5B illustrate cross-sectional views of an OR gate circuit element fabricated using a single semiconductor fin structure, in accordance with an embodiment of the present invention.
Figure 5B:
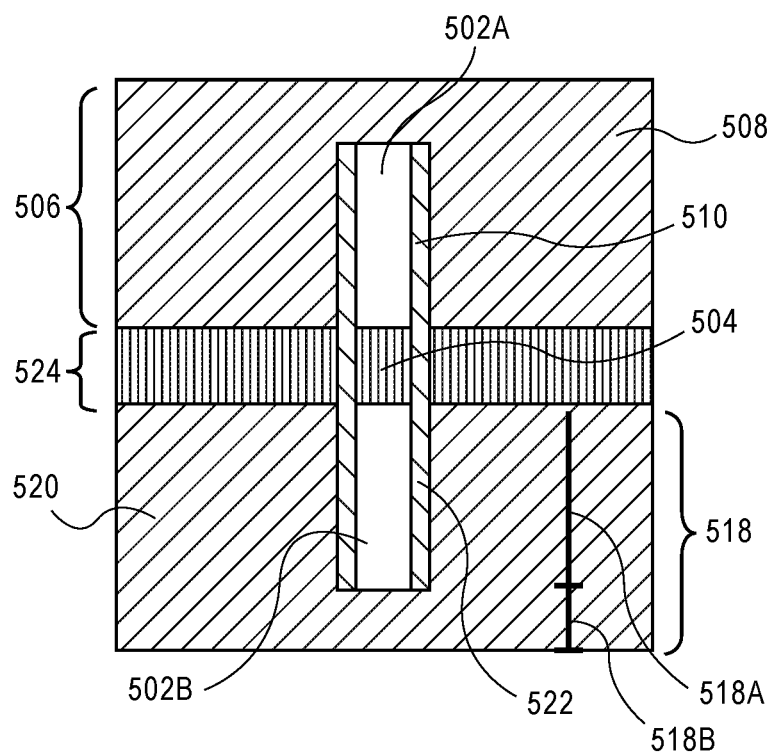

In a fourth example of a circuit element that may be fabricated using a single fin, FIGS. 5A and 5B illustrate cross-sectional views of an OR gate circuit element fabricated using a single semiconductor fin structure, in accordance with an embodiment of the present invention. FIG. 5A is a cross-sectional view taken through the gate structures and along the fin structure. FIG. 5B is a cross-sectional view taken through the fin structure and along the gate structures.

Referring to FIG. 5A, a semiconductor fin 502 can be viewed as being separated vertically into an upper region 502A and a lower region 502B. In one embodiment, the upper region 502A and the lower region 502B of the semiconductor fin 502 are separated by an insulating layer 504, such as a silicon oxide layer or other insulating oxide layer or a silicon nitride layer. The insulating layer 504 may include regions 504A and 504B of differing insulating material, depending on the integration scheme used to fabricate the structure, examples of which are described in greater detail below.

A first plurality of gate structures 506, such as NMOS gate structures, is included above the upper region 502A of the semiconductor fin 502. Each of the first plurality of gate structures 506 can include a gate electrode 508, a gate dielectric layer 510 and associated dielectric spacers 512. It is to be appreciated that the first plurality of gate structures 506 extends from the top of the upper region 502A of the semiconductor fin 502 (as shown) and further wraps the upper region 502A of the semiconductor fin 502 at locations into and out of the page with respect to the perspective shown in FIG. 5A. The upper region 502A of the semiconductor fin 502 may, in an embodiment, further include regrown source or drain regions. In an exemplary embodiment, the upper region 502A of the semiconductor fin 502 further includes first epitaxial N-type silicon regions 514, leaving remaining semiconductor regions (such as silicon regions) 516 of the upper region 502A of the semiconductor fin 502.

Although not depicted in FIG. 5A, but is shown in FIG. 5B, the lower region 502B of the semiconductor fin 502 is associated with a second plurality of gate structures 518, such as a second plurality of NMOS gate structures. Each of the second plurality of gate structures 518 can include a gate electrode 520, a gate dielectric layer 522 and associated dielectric spacers. It is to be appreciated that the second plurality of gate structures 518 wraps the lower region 502B of the semiconductor fin 502 at locations into and out of the page with respect to the perspective shown in FIG. 5A and, thus, can only be seen in the cross-sectional view of FIG. 5B, i.e., at regions 518A. As shown in FIG. 5B, in a specific embodiment where the semiconductor structure is a nanowire structure, each of the second plurality of gate structures 518 further wraps below the lower region 502B of the semiconductor fin 502 at locations 518B. However, in another embodiment, in the case of a fin structure that is a bulk fin structure or is otherwise coupled to an underlying substrate, portions 518B of each of the second plurality of gate structures 518 are not included, such that a tri-gate like structure is formed.

Referring again to FIG. 5A, in an embodiment, the lower region 502B of the semiconductor fin 502 may further include regrown source or drain regions. In an exemplary embodiment, the lower region 502B of the semiconductor fin 502 further includes epitaxial N-type silicon regions 526, leaving remaining semiconductor regions (such as silicon regions) 528 of the lower region 502B of the semiconductor fin 502.

In an embodiment, each of the first plurality of gate structures 506 is formed in a same trench as a corresponding one of the second plurality of gate structures 518, but vertically above the corresponding one of the second plurality of gate structures 518. In one such embodiment, each of the first plurality of gate structures 506 has a same conductivity type (e.g., N-type) and is isolated from the corresponding one of the second plurality of gate structures 518 by an insulating layer 524, as is depicted in FIG. 5B.

Referring again to FIGS. 5A and 5B, in an embodiment, wiring considerations such as backside wiring and wiring stacked between layers of semiconductor devices must be accounted for to bring the devices of the single fin together to form a circuit element. In one such embodiment, a first conductive contact 530 contacts a first upper region 514 and a first lower region 526. A second conductive contact 532 contacts a second upper region 514 and a second lower region 526. Thus, an entire OR gate structure is fabricated on a single fin 502.

NAND gate architectures can be divided into two parallel PMOS (e.g., FIGS. 6A and 6B) with output node connected to two serial NMOS (e.g., FIGS. 7A and 7B), as described below.

Figure 6A:
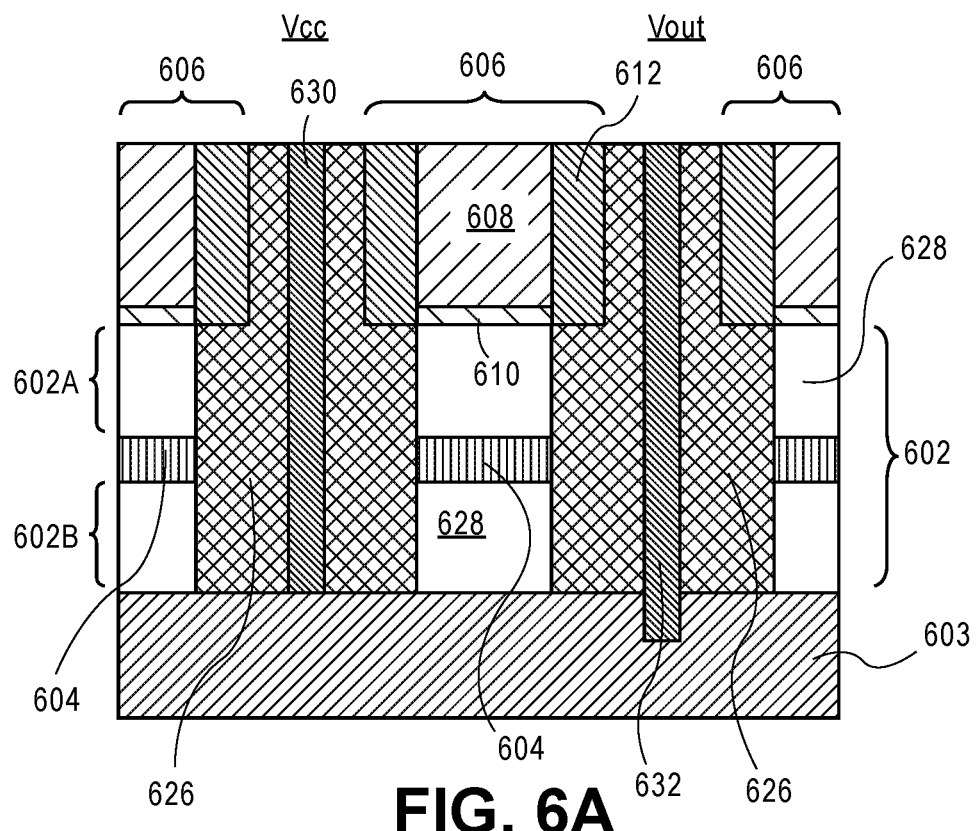
FIGS. 6A and 6B illustrate cross-sectional views of a circuit element based on two parallel PMOS devices fabricated using a single semiconductor fin structure as a component of a NAND gate circuit element, in accordance with an embodiment of the present invention.
Figure 6B:
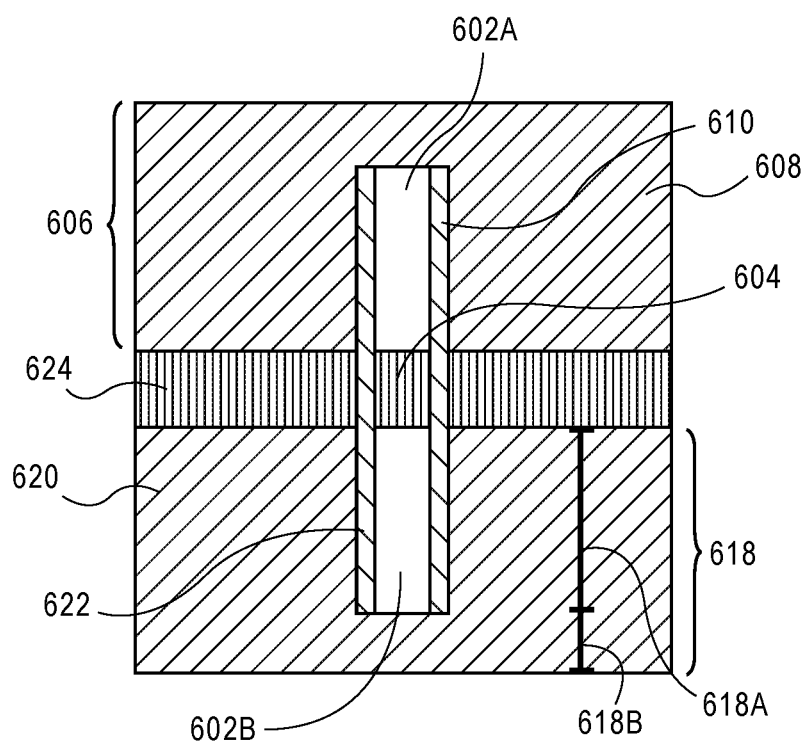

In a fifth example of a circuit element that may be fabricated using a single fin, FIGS. 6A and 6B illustrate cross-sectional views of a circuit element based on two parallel PMOS devices fabricated using a single semiconductor fin structure as a component of a NAND gate circuit element, in accordance with an embodiment of the present invention. FIG. 6A is a cross-sectional view taken through the gate structures and along the fin structure. FIG. 6B is a cross-sectional view taken through the fin structure and along the gate structures.

Referring to FIG. 6A, a semiconductor fin 602 can be viewed as being separated vertically into an upper region 602A and a lower region 602B. In one embodiment, the upper region 602A and the lower region 602B of the semiconductor fin 602 are separated by an insulating layer 604, such as a silicon oxide layer or other insulating oxide layer or a silicon nitride layer. The semiconductor fin 602 may be further disposed on an insulating layer 603, such as an oxide layer, as is depicted in FIG. 6A.

A first plurality of PMOS gate structures 606 is included above the upper region 602A of the semiconductor fin 602. Each of the first plurality of PMOS gate structures 606 can include a gate electrode 608, a gate dielectric layer 610 and associated dielectric spacers 612. It is to be appreciated that the first plurality of PMOS gate structures 606 extends from the top of the upper region 602A of the semiconductor fin 602 (as shown) and further wraps the upper region 602A of the semiconductor fin 602 at locations into and out of the page with respect to the perspective shown in FIG. 6A.

Although not depicted in FIG. 6A, but is shown in FIG. 6B, the lower region 602B of the semiconductor fin 602 is associated with a second plurality of PMOS gate structures 618. Each of the second plurality of PMOS gate structures 618 can include a gate electrode 620, a gate dielectric layer 622 and associated dielectric spacers. It is to be appreciated that the second plurality of PMOS gate structures 618 wraps the lower region 602B of the semiconductor fin 602 at locations into and out of the page with respect to the perspective shown in FIG. 6A and, thus, can only be seen in the cross-sectional view of FIG. 6B, i.e., at regions 618A. As shown in FIG. 6B, in a specific embodiment where the semiconductor structure is a nanowire structure, each of the second plurality of PMOS gate structures 618 further wraps below the lower region 602B of the semiconductor fin 602 at locations 618B. However, in another embodiment, in the case of a fin structure that is a bulk fin structure or is otherwise coupled to an underlying substrate or the oxide layer 603, portions 618B of each of the second plurality of PMOS gate structures 618 are not included, such that a tri-gate like structure is formed.

Referring again to FIG. 6A, in an embodiment, both the upper region 602A and the lower region 602B of the semiconductor fin 602 may further include regrown source or drain regions. In an exemplary embodiment, both the upper region 602A and the lower region 602B of the semiconductor fin 602 further include epitaxial P-type silicon germanium regions 626, leaving remaining semiconductor regions (such as silicon regions) 628 of the semiconductor fin 602.

In an embodiment, each of the first plurality of PMOS gate structures 606 is formed in a same trench as a corresponding one of the second plurality of PMOS gate structures 618, but vertically above the corresponding one of the second plurality of PMOS gate structures 618. In one such embodiment, each of the first plurality of PMOS gate structures 606 is isolated from the corresponding one of the second plurality of PMOS gate structures 618 by an insulating layer 624, as is depicted in FIG. 6B.

Referring again to FIGS. 6A and 6B, in an embodiment, wiring considerations such as backside wiring and wiring stacked between layers of semiconductor devices must be accounted for to bring the devices of the single fin together to form a circuit element. In one such embodiment, a first conductive contact 630 contacts a first epitaxial P-type silicon germanium region 626 to form a Vcc contact. A second conductive contact 632 contacts a second epitaxial P-type silicon germanium region 626 to form a Vout contact.

Figure 7A:
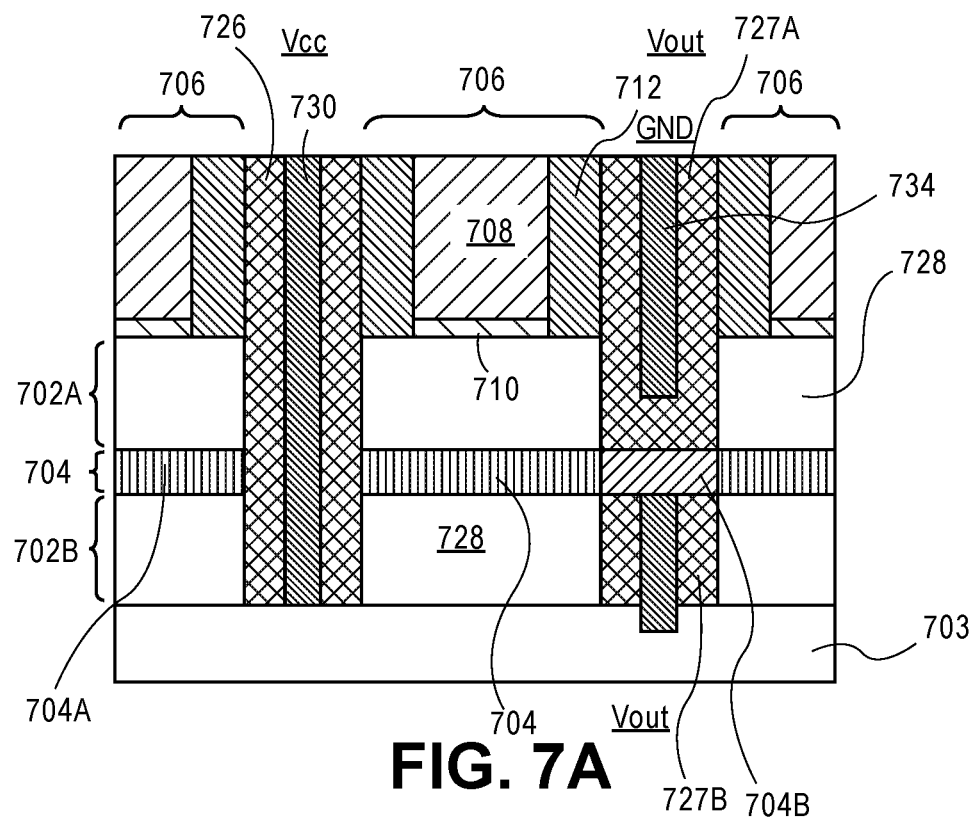
FIGS. 7A and 7B illustrate cross-sectional views of a circuit element based on two serial NMOS devices fabricated using a single semiconductor fin structure as a component of a NAND gate circuit element for coupling with the two parallel PMOS devices of FIGS. 6A and 6B, in accordance with an embodiment of the present invention.
Figure 7B:
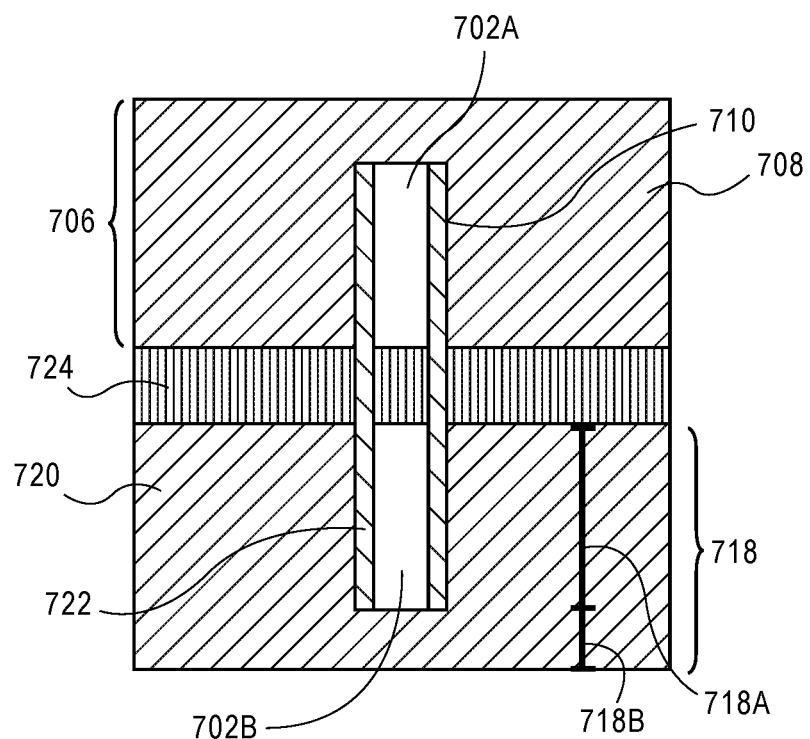

In a sixth example of a circuit element that may be fabricated using a single fin, FIGS. 7A and 7B illustrate cross-sectional views of a circuit element based on two serial NMOS devices fabricated using a single semiconductor fin structure as a component of a NAND gate circuit element for coupling with the two parallel PMOS devices of FIGS. 6A and 6B, in accordance with an embodiment of the present invention. FIG. 7A is a cross-sectional view taken through the gate structures and along the fin structure. FIG. 7B is a cross-sectional view taken through the fin structure and along the gate structures.

Referring to FIG. 7A, a semiconductor fin 702 can be viewed as being separated vertically into an upper region 702A and a lower region 702B. In one embodiment, the upper region 702A and the lower region 702B of the semiconductor fin 702 are separated by an insulating layer 704, such as a silicon oxide layer or other insulating oxide layer or a silicon nitride layer. The semiconductor fin 702 may be further disposed on an insulating layer 703, such as an oxide layer, as is depicted in FIG. 7A.

A first plurality of NMOS gate structures 706 is included above the upper region 702A of the semiconductor fin 702. Each of the first plurality of NMOS gate structures 706 can include a gate electrode 708, a gate dielectric layer 710 and associated dielectric spacers 712. It is to be appreciated that the first plurality of NMOS gate structures 706 extends from the top of the upper region 702A of the semiconductor fin 702 (as shown) and further wraps the upper region 702A of the semiconductor fin 702 at locations into and out of the page with respect to the perspective shown in FIG. 7A.

Although not depicted in FIG. 7A, but is shown in FIG. 7B, the lower region 702B of the semiconductor fin 702 is associated with a second plurality of NMOS gate structures 718. Each of the second plurality of NMOS gate structures 718 can include a gate electrode 720, a gate dielectric layer 722 and associated dielectric spacers. It is to be appreciated that the second plurality of NMOS gate structures 718 wraps the lower region 702B of the semiconductor fin 702 at locations into and out of the page with respect to the perspective shown in FIG. 7A and, thus, can only be seen in the cross-sectional view of FIG. 7B, i.e., at regions 718A. As shown in FIG. 7B, in a specific embodiment where the semiconductor structure is a nanowire structure, each of the second plurality of NMOS gate structures 718 further wraps below the lower region 702B of the semiconductor fin 702 at locations 718B. However, in another embodiment, in the case of a fin structure that is a bulk fin structure or is otherwise coupled to an underlying substrate or the oxide layer 703, portions 718B of each of the second plurality of NMOS gate structures 718 are not included, such that a tri-gate like structure is formed.

Referring again to FIG. 7A, in an embodiment, both the upper region 702A and the lower region 702B of the semiconductor fin 702 may further include regrown source or drain regions. In an exemplary embodiment, both the upper region 702A and the lower region 702B of the semiconductor fin 702 further include an epitaxial N-type silicon region 726, leaving remaining semiconductor regions (such as silicon regions) 728 of the semiconductor fin 702. Also, an upper epitaxial N-type silicon region 727A is formed in only the upper region 702A of the semiconductor fin 702, while a lower epitaxial N-type silicon region 727B is formed in only the lower region 702B of the semiconductor fin 702. The insulating layer portion 704B separates the upper epitaxial N-type silicon region 727A from the lower epitaxial N-type silicon region 727B.

In an embodiment, each of the first plurality of NMOS gate structures 706 is formed in a same trench as a corresponding one of the second plurality of NMOS gate structures 718, but vertically above the corresponding one of the second plurality of NMOS gate structures 718. In one such embodiment, each of the first plurality of NMOS gate structures 706 is isolated from the corresponding one of the second plurality of NMOS gate structures 718 by an insulating layer 724, as is depicted in FIG. 7B.

Referring again to FIGS. 7A and 7B, in an embodiment, wiring considerations such as backside wiring and wiring stacked between layers of semiconductor devices must be accounted for to bring the devices of the single fin together to form a circuit element. In one such embodiment, a first conductive contact 730 contacts the epitaxial N-type silicon region 726. A second conductive contact 732 contacts the lower epitaxial N-type silicon region 727B to form a Vout contact. A third conductive contact 734 contacts the upper epitaxial N-type silicon region 727A to form a contact to ground (GND).

In a manner similar to the NAND architecture, NOR gate architecture can be divided into two parallel NMOS (e.g., FIGS. 8A and 8B), output of which is connected to output of two serial PMOS (e.g., FIGS. 8C and 8D), as is described below.

Figure 8A:
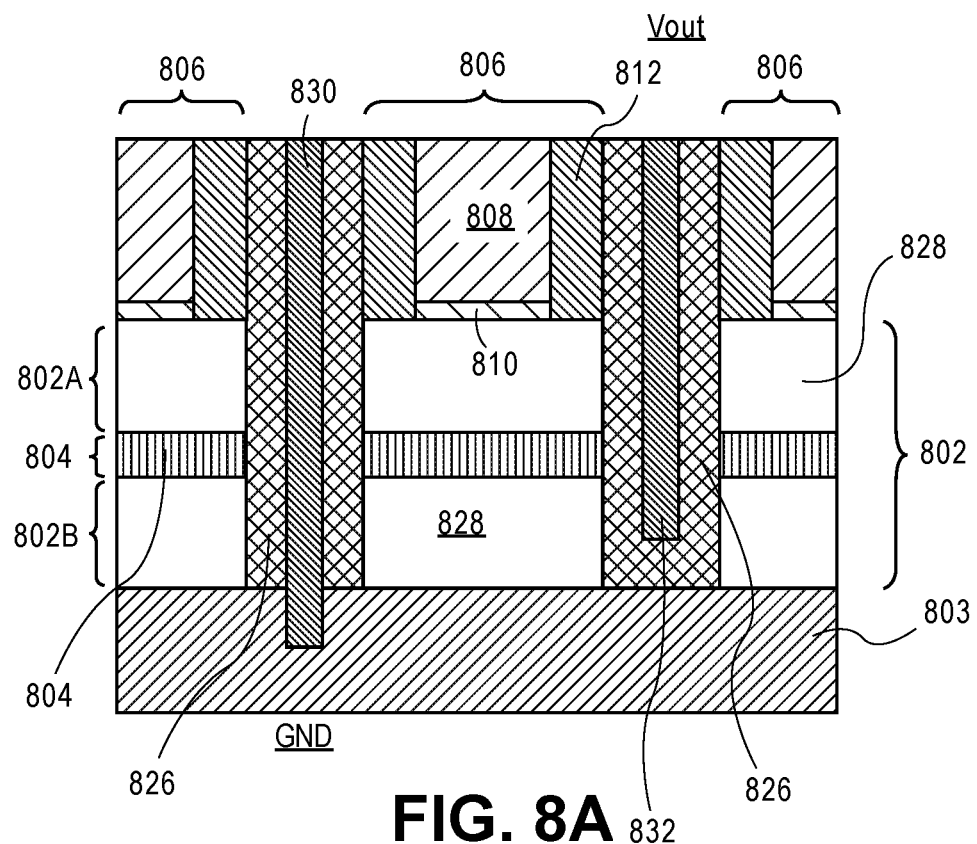
FIGS. 8A and 8B illustrate cross-sectional views of a circuit element based on two parallel NMOS devices fabricated using a single semiconductor fin structure as a component of a NOR gate circuit element, in accordance with an embodiment of the present invention.
Figure 8B:
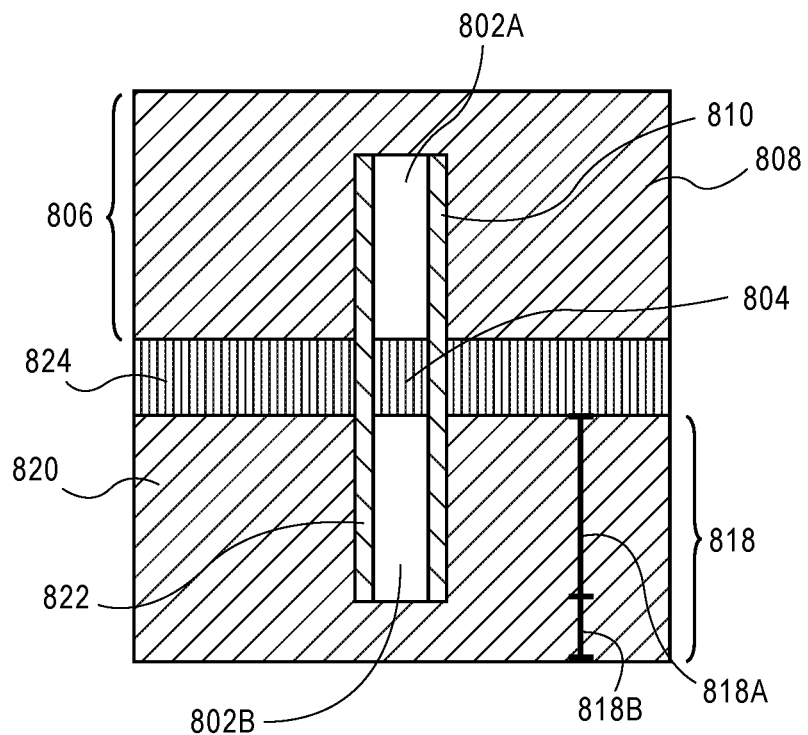

In a seventh example of a circuit element that may be fabricated using a single fin, FIGS. 8A and 8B illustrate cross-sectional views of a circuit element based on two parallel NMOS devices fabricated using a single semiconductor fin structure as a component of a NOR gate circuit element, in accordance with an embodiment of the present invention. FIG. 8A is a cross-sectional view taken through the gate structures and along the fin structure. FIG. 8B is a cross-sectional view taken through the fin structure and along the gate structures.

Referring to FIG. 8A, a semiconductor fin 802 can be viewed as being separated vertically into an upper region 802A and a lower region 802B. In one embodiment, the upper region 802A and the lower region 802B of the semiconductor fin 802 are separated by an insulating layer 804, such as a silicon oxide layer or other insulating oxide layer or a silicon nitride layer. The semiconductor fin 802 may be further disposed on an insulating layer 803, such as an oxide layer, as is depicted in FIG. 8A.

A first plurality of NMOS gate structures 806 is included above the upper region 802A of the semiconductor fin 802. Each of the first plurality of NMOS gate structures 806 can include a gate electrode 808, a gate dielectric layer 810 and associated dielectric spacers 812. It is to be appreciated that the first plurality of NMOS gate structures 806 extends from the top of the upper region 802A of the semiconductor fin 802 (as shown) and further wraps the upper region 802A of the semiconductor fin 802 at locations into and out of the page with respect to the perspective shown in FIG. 8A.

Although not depicted in FIG. 8A, but is shown in FIG. 8B, the lower region 802B of the semiconductor fin 802 is associated with a second plurality of NMOS gate structures 818. Each of the second plurality of NMOS gate structures 818 can include a gate electrode 820, a gate dielectric layer 822 and associated dielectric spacers. It is to be appreciated that the second plurality of NMOS gate structures 818 wraps the lower region 802B of the semiconductor fin 802 at locations into and out of the page with respect to the perspective shown in FIG. 8A and, thus, can only be seen in the cross-sectional view of FIG. 8B, i.e., at regions 818A. As shown in FIG. 8B, in a specific embodiment where the semiconductor structure is a nanowire structure, each of the second plurality of NMOS gate structures 818 further wraps below the lower region 802B of the semiconductor fin 802 at locations 818B. However, in another embodiment, in the case of a fin structure that is a bulk fin structure or is otherwise coupled to an underlying substrate or the oxide layer 803, portions 818B of each of the second plurality of NMOS gate structures 818 are not included, such that a tri-gate like structure is formed.

Referring again to FIG. 8A, in an embodiment, both the upper region 802A and the lower region 802B of the semiconductor fin 802 may further include regrown source or drain regions. In an exemplary embodiment, both the upper region 802A and the lower region 802B of the semiconductor fin 802 further include epitaxial N-type silicon regions 826, leaving remaining semiconductor regions (such as silicon regions) 828 of the semiconductor fin 802.

In an embodiment, each of the first plurality of NMOS gate structures 806 is formed in a same trench as a corresponding one of the second plurality of NMOS gate structures 818, but vertically above the corresponding one of the second plurality of NMOS gate structures 818. In one such embodiment, each of the first plurality of NMOS gate structures 806 is isolated from the corresponding one of the second plurality of NMOS gate structures 818 by an insulating layer 824, as is depicted in FIG. 8B.

Referring again to FIGS. 8A and 8B, in an embodiment, wiring considerations such as backside wiring and wiring stacked between layers of semiconductor devices must be accounted for to bring the devices of the single fin together to form a circuit element. In one such embodiment, a first conductive contact 830 contacts a first epitaxial N-type silicon region 826 to form a ground (GND) contact. A second conductive contact 832 contacts a second epitaxial N-type silicon region 826 to form a Vout contact. It is to be appreciated that the contacts can be made either from the top or from the bottom on the devices, depending on how it is determined to deliver power.

Figure 8C:
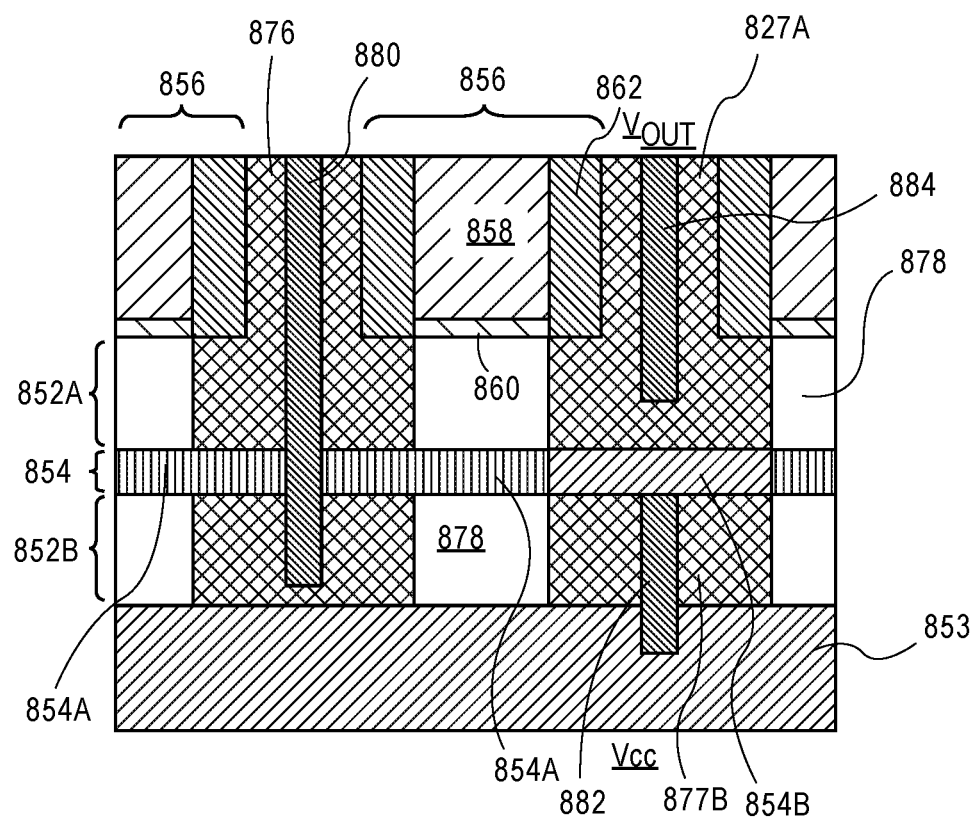
FIGS. 8C and 8D illustrate cross-sectional views of a circuit element based on two serial PMOS devices fabricated using a single semiconductor fin structure as a component of a NOR gate circuit element for coupling with the two parallel NMOS devices of FIGS. 8A and 8B, in accordance with an embodiment of the present invention.
Figure 8D:
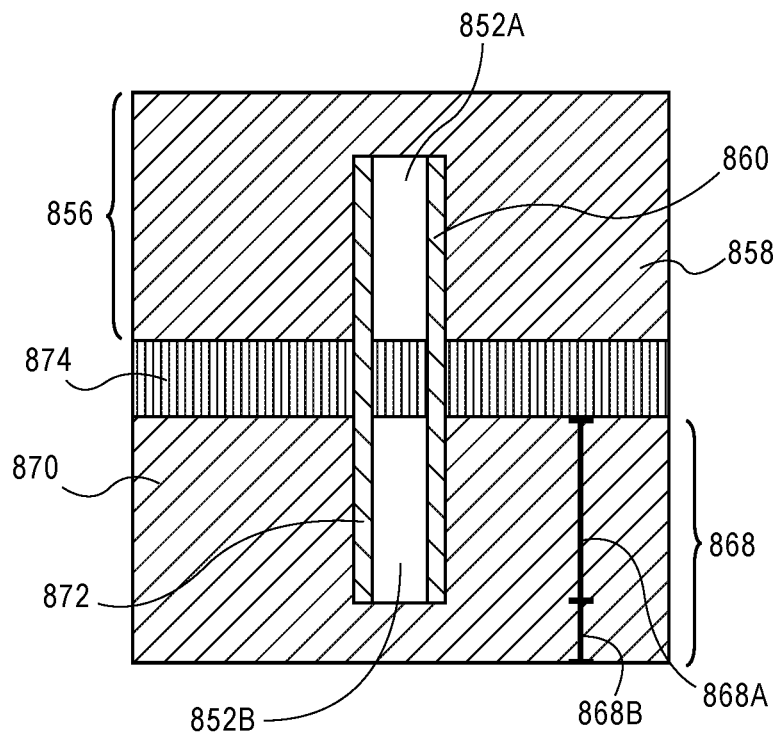

In an eighth example of a circuit element that may be fabricated using a single fin, FIGS. 8C and 8D illustrate cross-sectional views of a circuit element based on two serial PMOS devices fabricated using a single semiconductor fin structure as a component of a NOR gate circuit element for coupling with the two parallel NMOS devices of FIGS. 8A and 8B, in accordance with an embodiment of the present invention. FIG. 8C is a cross-sectional view taken through the gate structures and along the fin structure. FIG. 8D is a cross-sectional view taken through the fin structure and along the gate structures.

Referring to FIG. 8C, a semiconductor fin 852 can be viewed as being separated vertically into an upper region 852A and a lower region 852B. In one embodiment, the upper region 852A and the lower region 852B of the semiconductor fin 852 are separated by an insulating layer 854, such as a silicon oxide layer or other insulating oxide layer or a silicon nitride layer. The semiconductor fin 852 may be further disposed on an insulating layer 853, such as an oxide layer, as is depicted in FIG. 8C.

A first plurality of PMOS gate structures 856 is included above the upper region 852A of the semiconductor fin 852. Each of the first plurality of PMOS gate structures 856 can include a gate electrode 858, a gate dielectric layer 860 and associated dielectric spacers 862. It is to be appreciated that the first plurality of PMOS gate structures 856 extends from the top of the upper region 852A of the semiconductor fin 852 (as shown) and further wraps the upper region 852A of the semiconductor fin 852 at locations into and out of the page with respect to the perspective shown in FIG. 8C.

Although not depicted in FIG. 8C, but is shown in FIG. 8D, the lower region 852B of the semiconductor fin 852 is associated with a second plurality of PMOS gate structures 868. Each of the second plurality of PMOS gate structures 868 can include a gate electrode 870, a gate dielectric layer 872 and associated dielectric spacers. It is to be appreciated that the second plurality of PMOS gate structures 868 wraps the lower region 852B of the semiconductor fin 852 at locations into and out of the page with respect to the perspective shown in FIG. 8C and, thus, can only be seen in the cross-sectional view of FIG. 8D, i.e., at regions 868A. As shown in FIG. 8D, in a specific embodiment where the semiconductor structure is a nanowire structure, each of the second plurality of PMOS gate structures 868 further wraps below the lower region 852B of the semiconductor fin 852 at locations 868B. However, in another embodiment, in the case of a fin structure that is a bulk fin structure or is otherwise coupled to an underlying substrate or the oxide layer 853, portions 868B of each of the second plurality of PMOS gate structures 868 are not included, such that a tri-gate like structure is formed.

Referring again to FIG. 8C, in an embodiment, both the upper region 852A and the lower region 852B of the semiconductor fin 852 may further include regrown source or drain regions. In an exemplary embodiment, both the upper region 852A and the lower region 852B of the semiconductor fin 852 further include an epitaxial P-type silicon germanium region 876, leaving remaining semiconductor regions (such as silicon regions) 878 of the semiconductor fin 852. Also, an upper epitaxial P-type silicon germanium region 877A is formed in only the upper region 852A of the semiconductor fin 852, while a lower epitaxial P-type silicon germanium region 877B is formed in only the lower region 852B of the semiconductor fin 852. The insulating layer portion 854B separates the upper epitaxial P-type silicon germanium region 877A from the lower epitaxial P-type silicon germanium region 877B.

In an embodiment, each of the first plurality of PMOS gate structures 856 is formed in a same trench as a corresponding one of the second plurality of PMOS gate structures 868, but vertically above the corresponding one of the second plurality of PMOS gate structures 868. In one such embodiment, each of the first plurality of PMOS gate structures 856 is isolated from the corresponding one of the second plurality of PMOS gate structures 868 by an insulating layer 874, as is depicted in FIG. 8D.

Referring again to FIGS. 8C and 8D, in an embodiment, wiring considerations such as backside wiring and wiring stacked between layers of semiconductor devices must be accounted for to bring the devices of the single fin together to form a circuit element. In one such embodiment, a first conductive contact 880 contacts the epitaxial P-type silicon germanium region 876. A second conductive contact 882 contacts the lower epitaxial P-type silicon germanium region 877B to form a Vcc contact. A third conductive contact 884 contacts the upper epitaxial P-type silicon germanium region 877A to form a Vout contact. It is to be appreciated that the contacts can be made either from the top or from the bottom on the devices, depending on how it is determined to deliver power.

In another aspect, in order to manufacture circuit elements instead of a single transistor per corresponding fin, in an embodiment, isolation of two transistors for each fin is required. Tips and source/drain regions can then be defined in the bottom transistor followed by contact formation in the bottom transistor. Subsequently, isolation of the bottom transistor from the top transistor is performed. Tips and source/drain region are then formed for the top transistor. Subsequently, metal gates are fabricated for both the bottom and top transistors, and contacts to the top transistor are formed. Contact formation for the top transistor can also be performed subsequent to forming metal gates for the top and bottom transistors. In an exemplary embodiment, FIGS. 9-20 illustrate cross-sectional views of various operations for fabricating an inverter structure (left-hand-side of each of FIGS. 9-20) and a pass gate structure (right-hand-side of each of FIGS. 9-20), in accordance with an embodiment of the present invention.

Figure 9:
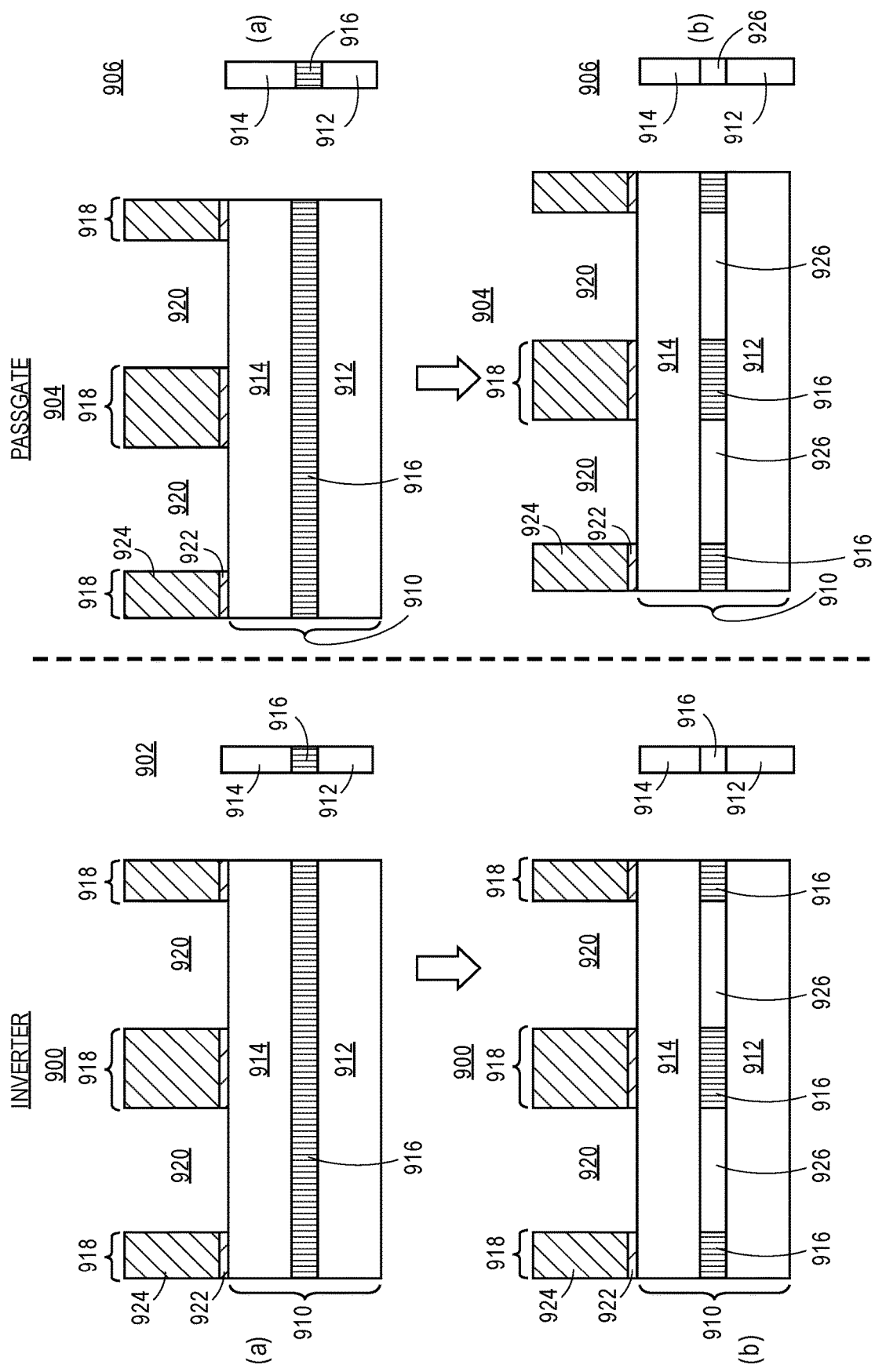
FIGS. 9-20 illustrate cross-sectional views of various operations for fabricating an inverter structure (left-hand-side of each of FIGS. 9-20) and a pass gate structure (right-hand-side of each of FIGS. 9-20), in accordance with an embodiment of the present invention.

Referring to FIG. 9, 900 is a cross-sectional view taken through the gate structures and along the fin structure, and 902 is a cross-sectional view taken through a source/drain region of the fin structure, in an operation in the fabrication of an inverter circuit element. 904 is a cross-sectional view taken through the gate structures and along the fin structure, and 906 is a cross-sectional view taken through a source/drain region of the fin structure, in an operation in the fabrication of a pass gate circuit element.

Referring to part (a) of FIG. 9, a semiconductor fin 910 includes a lower silicon layer 912 and an upper silicon layer 914. The lower silicon layer 912 is separated from the upper silicon layer 914 by a silicon germanium layer 916. A plurality of dummy gate structures 918 is formed over the semiconductor fin 910, with source/drain locations 920 between each of the plurality of dummy gate structures 918. Each of the plurality of dummy gate structures 918 may include a dummy gate dielectric layer 922 and a dummy gate electrode 924, as is depicted in FIG. 9.

Semiconductor fin 910 formation may begin with a starting structure of blanket silicon/SiGe/silicon layers which is then etched to provide a fin structure. A shallow trench isolation oxide may be formed adjacent lower regions of the etched fin stack. The plurality of dummy gate structures 918 may form a grid pattern into and out of the page, and the patterning may involve pitch halving or pitch quartering patterning. Additionally, it is to be appreciated that the plurality of dummy gate structures 918 extends from the top of the upper silicon layer 914 of the semiconductor fin 910 (as shown) and further wraps the upper silicon layer 914, the lower silicon layer 912, and the silicon germanium layer 916 of the semiconductor fin 910 at locations into and out of the page with respect to the perspective shown in 900 and 904.

Referring to part (b) of FIG. 9, regions 926 of the silicon germanium layer 916 of the semiconductor fin 910 are removed. The regions 926 correspond with source/drain locations 920. The regions 926 of the silicon germanium layer 916 of the semiconductor fin 910 may be removed using an etch process selective against etching of silicon.

Figure 10:
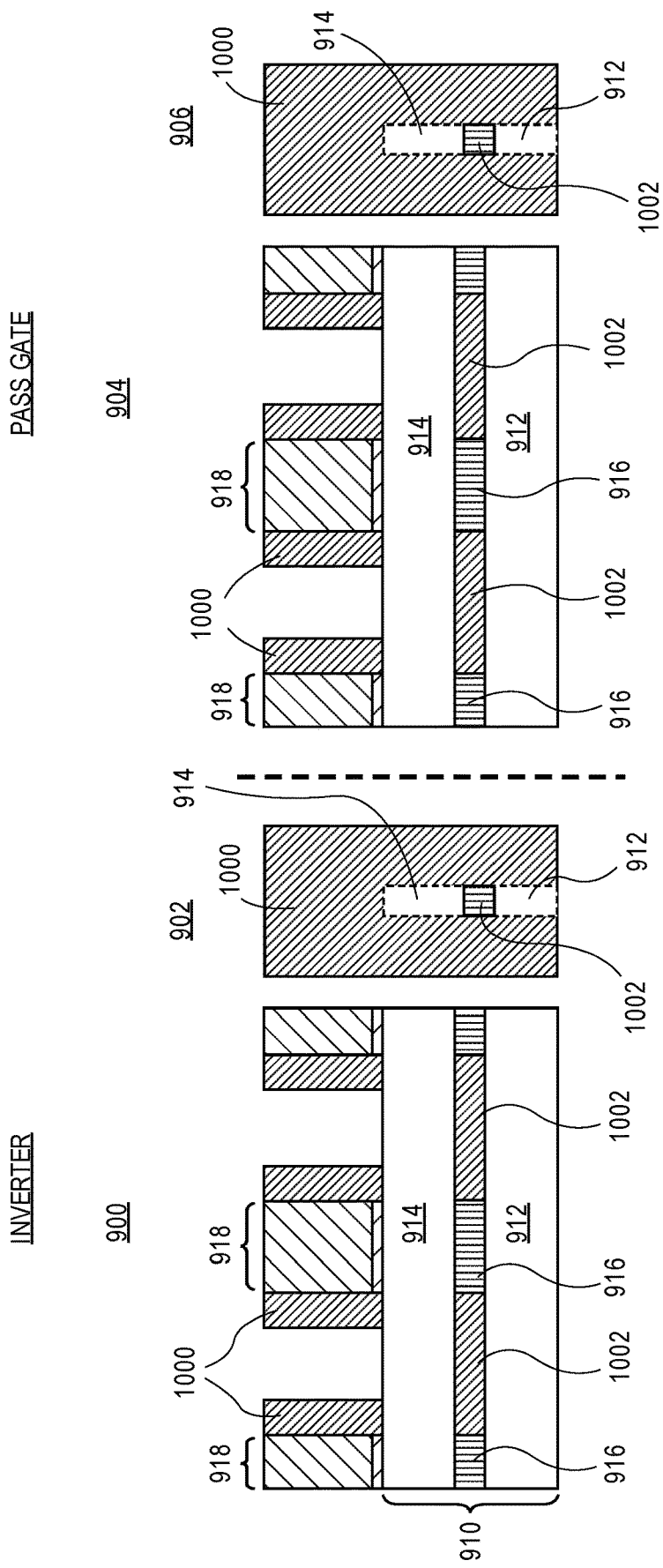

Referring to FIG. 10, dielectric spacers 1000 are formed adjacent the sidewalls of each of the plurality of dummy gate structures 918. The dielectric spacers 1000 may be fabricated by first forming a conformal dielectric layer on the structure of part (b) of FIG. 9 and then anisotropically etching the conformal dielectric layer. In an embodiment, the dielectric material remains in the removed regions 926 of the silicon germanium layer 916 to form dielectric regions 1002, as is depicted in FIG. 10.

Figure 11:
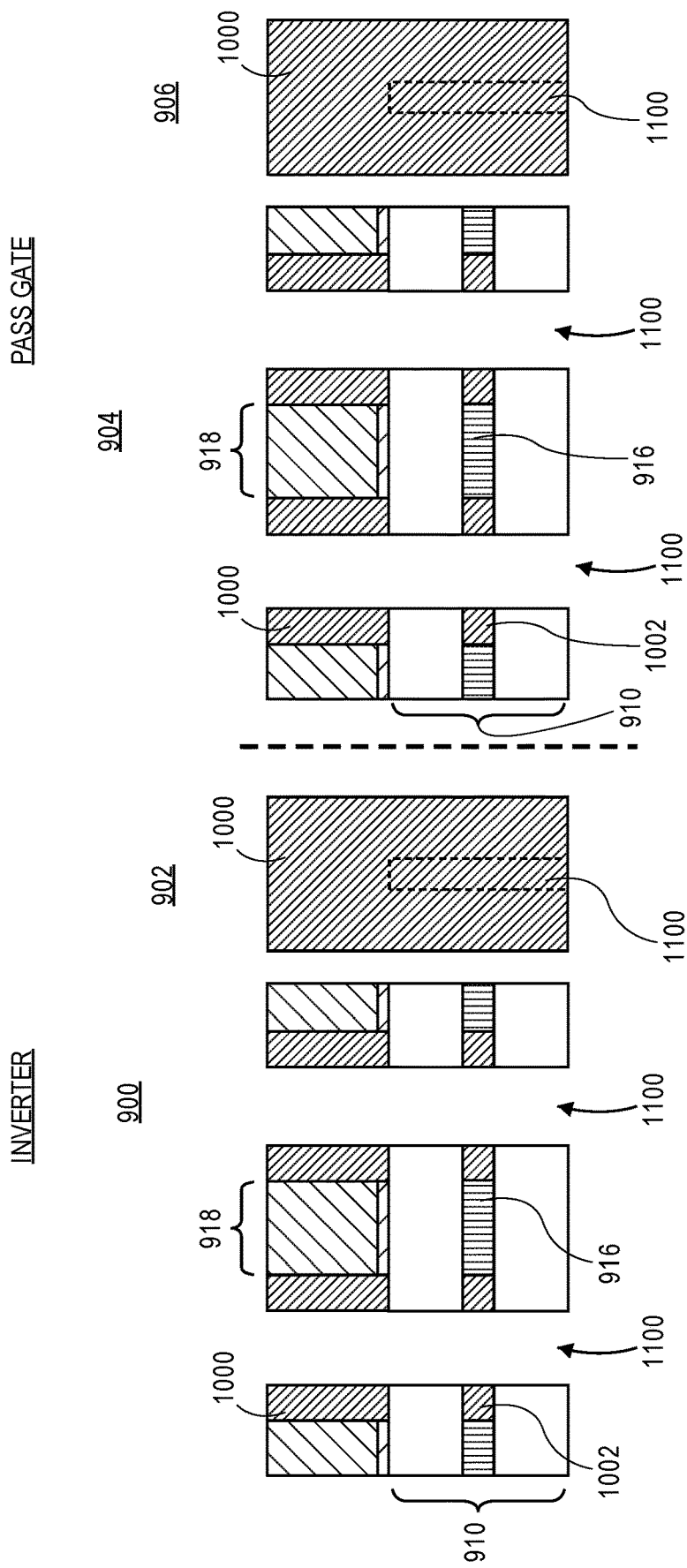

Referring to FIG. 11, a vertical undercut etch is performed to remove portions of the semiconductor fin 910 from the source/drain locations 920 to form undercut regions 1100. The width of the undercut feature may depend on whether N-type or P-type semiconductor regions will ultimately be formed in the undercut regions 1100.

Figure 12:
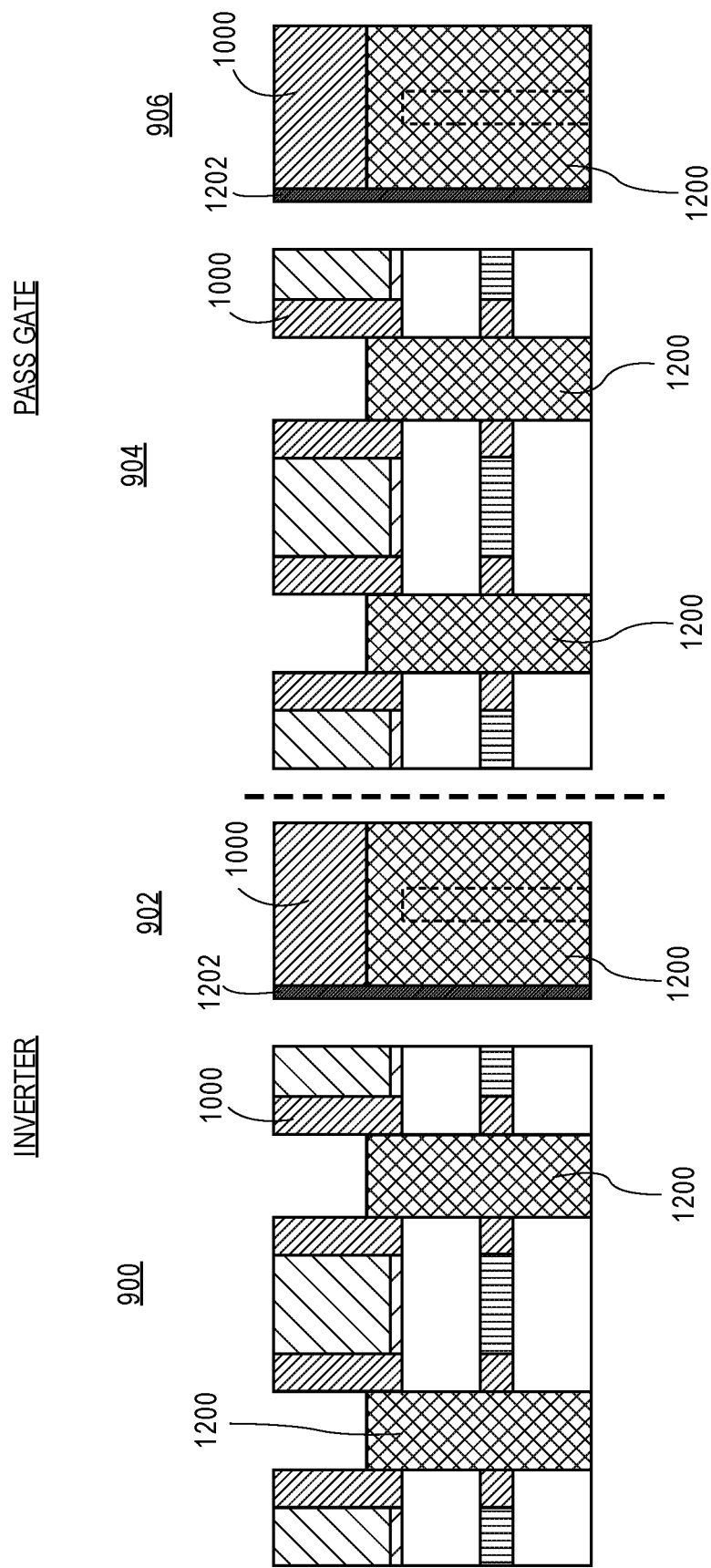

Referring to FIG. 12, epitaxial semiconductor regions 1200 are formed in the undercut regions 1100 of the structure of FIG. 11. The epitaxial regions may be N-type (such as N-type silicon) or P-type (such as P-type silicon germanium) regions, depending on the structural arrangement required. It is to be appreciated that growth from fin to fin may be restricted by an isolation wall 1202, as is used in a SAGE type process.

Figure 13:
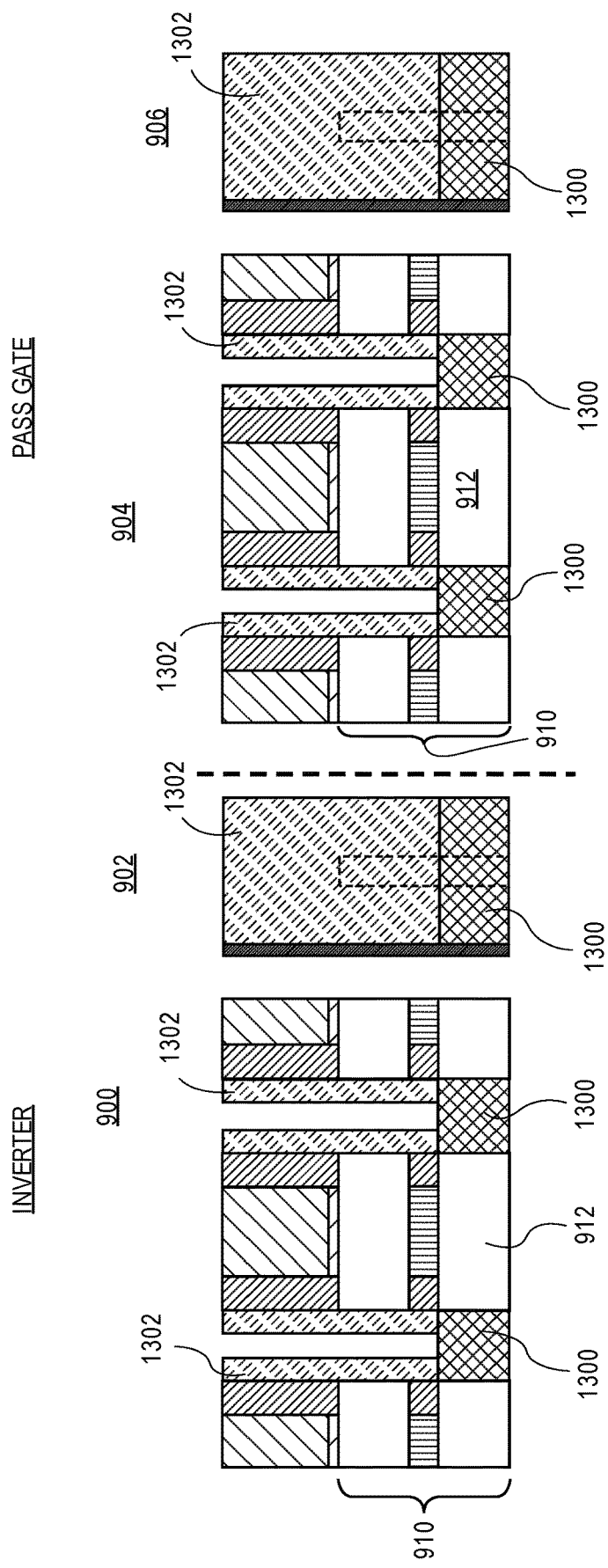

Referring to FIG. 13, the epitaxial semiconductor regions 1200 of the structure of FIG. 12 are etched back to form lower epitaxial source/drain regions 1300. Subsequently, dielectric spacers 1302 are formed above the lower epitaxial source/drain regions 1300. In an embodiment, the lower epitaxial source/drain regions 1300 are formed to a height at or below the height of the lower silicon layer 912 of the semiconductor fin 910. The dielectric spacers 1302 may be sacrificial and may be used for ultimate fabrication of a self-aligned contact, as is described below.

Figure 14:
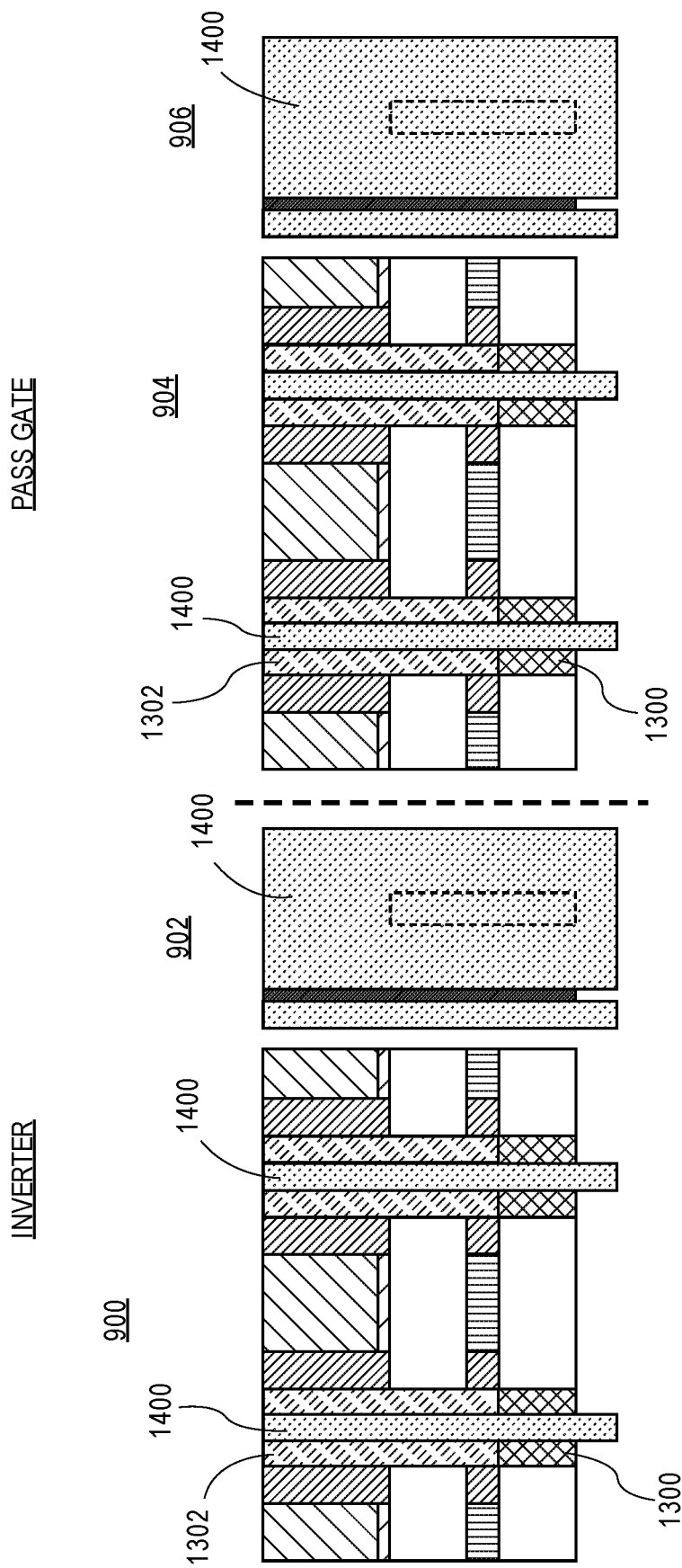

Referring to FIG. 14, trench contacts 1400 are formed into the lower epitaxial source/drain regions 1300 of the structure of FIG. 13 and within the dielectric spacers 1302. In an embodiment, the trench contacts 1400 ultimately provide contact to a lower transistor fabricated for the lower portion 912 of the semiconductor fin 910.

Figure 15:
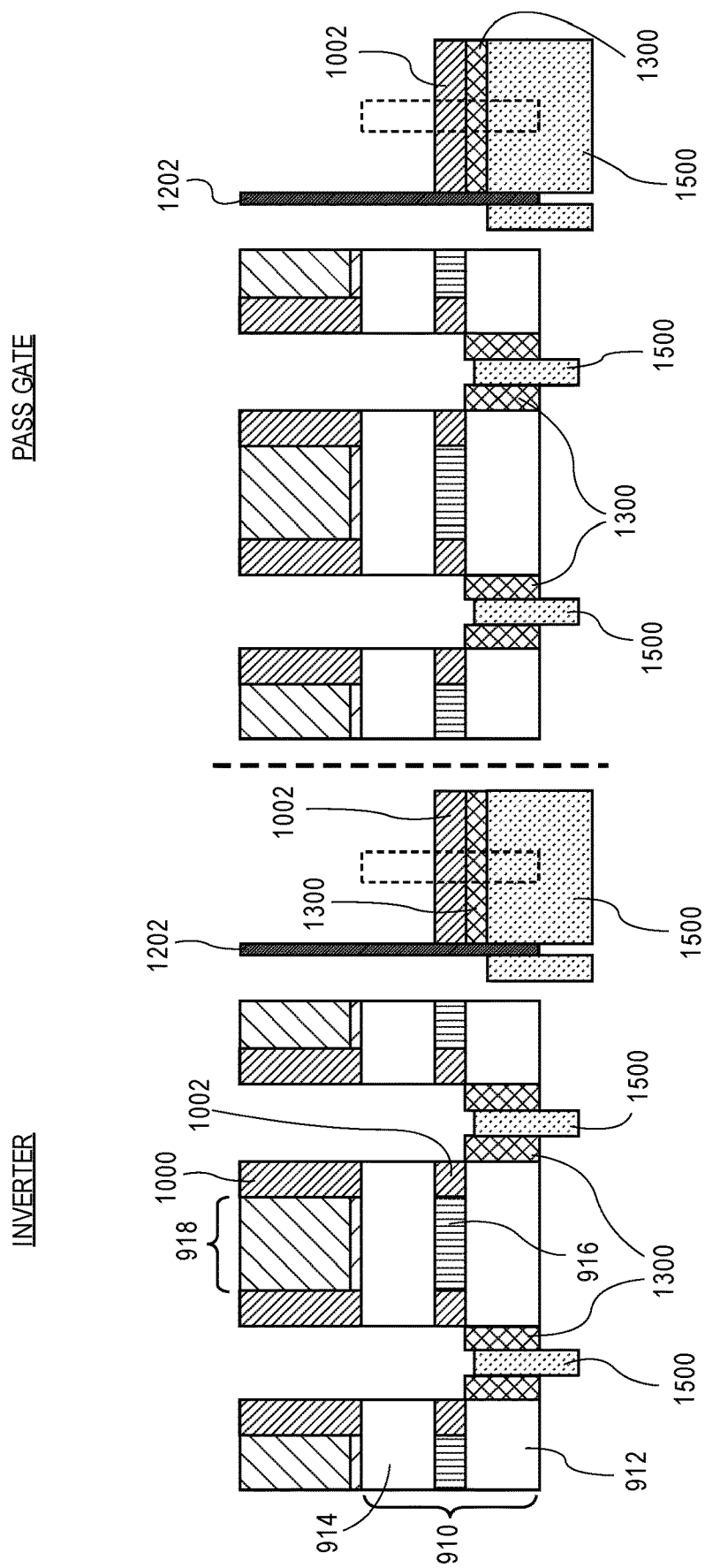

Referring to FIG. 15, the trench contacts 1400 of the structure of FIG. 14 are recessed to provide lower contacts 1500. Also, the dielectric spacers 1302 may be removed at this stage, as is depicted in FIG. 15.

Figure 16:
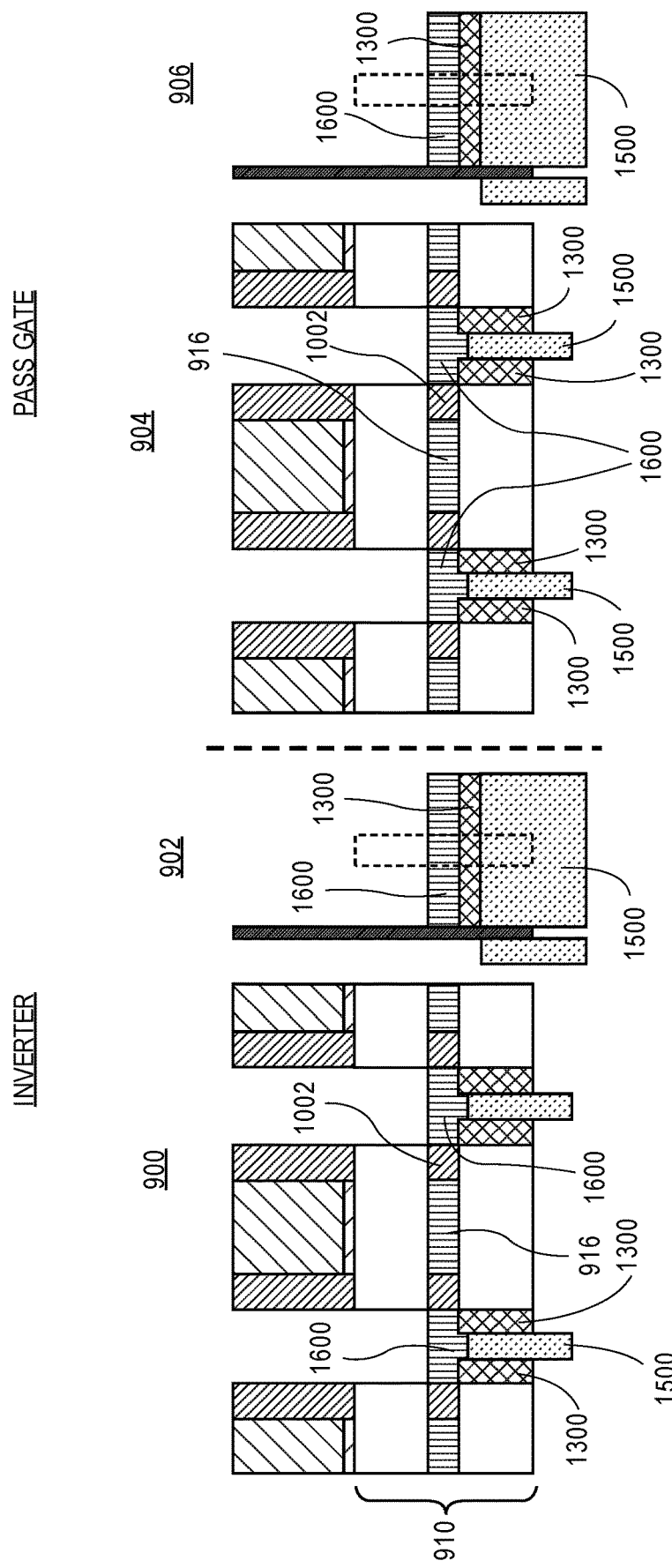

Referring to FIG. 16, an isolation oxide layer 1600 is then formed on the lower contacts 1500 and the lower epitaxial source/drain regions 1300 of the structure of FIG. 15. In an embodiment, the isolation oxide layer 1600 is formed using an oxide fill, recess and wet clean processing scheme. In an embodiment, the top of the isolation oxide layer 1600 is approximately at the same level as the top of the silicon geranium layer 916 of the semiconductor fin 910. In an embodiment, the isolation oxide layer 1600 is ultimately used to isolate corresponding bottom and top transistors.

Figure 17:
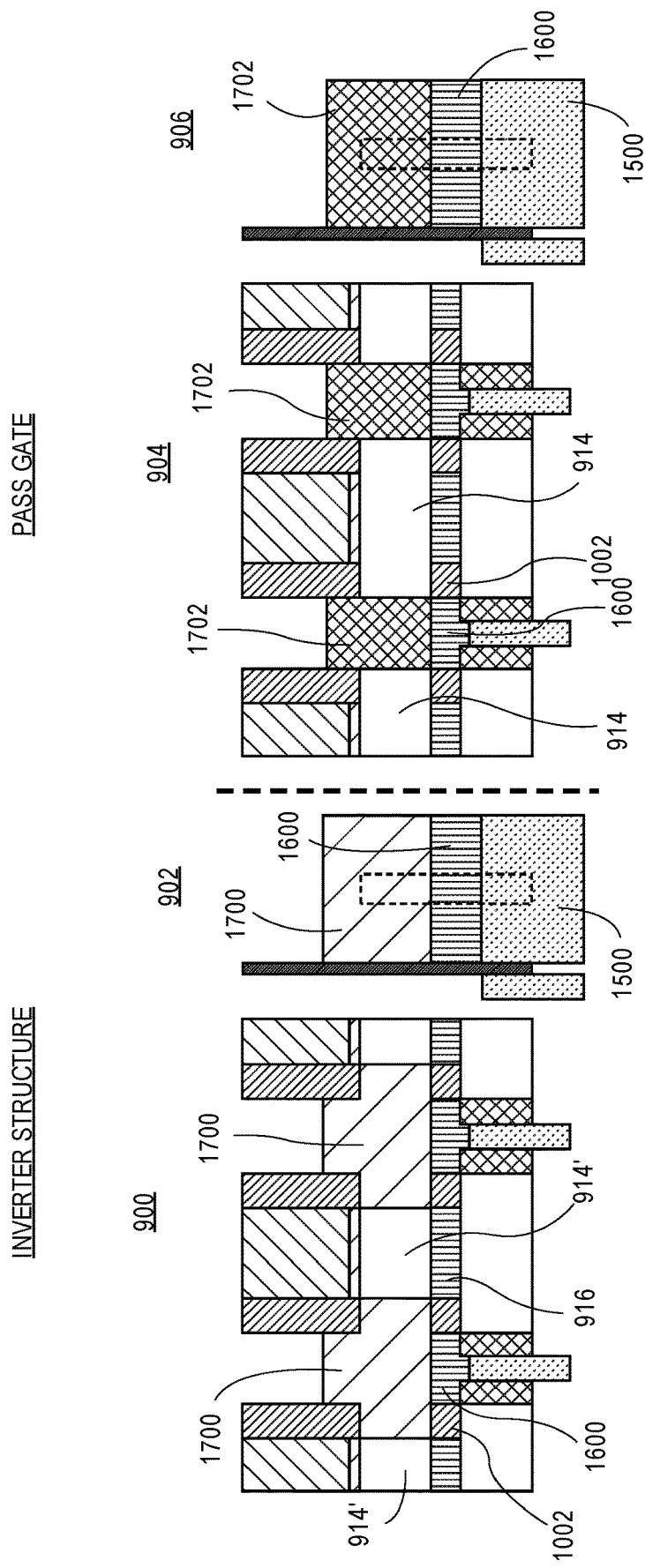

Referring to the inverter structure portion of FIG. 17, the upper silicon layer 914 is undercut to form laterally recessed upper silicon layer portions 914'. Epitaxial growth of upper source/drain regions 1700 is then performed. In an embodiment, the lower transistor of the inverter structure is an NMOS device and the lower epitaxial source/drain regions 1300 are N-type, such as N-type silicon regions. In that embodiment, the upper transistor of the inverter structure is a PMOS device and the upper epitaxial source/drain regions 1700 are P-type, such as P-type silicon germanium regions, as is depicted in FIG. 17.

Referring to the pass gate portion of FIG. 17, epitaxial growth of upper source/drain regions 1702 is performed. In an embodiment, the lower transistor of the pass gate structure is an NMOS device and the lower epitaxial source/drain regions 1300 are N-type, such as N-type silicon regions. In that embodiment, the upper transistor of the pass gate structure is also an NMOS device and the upper epitaxial source/drain regions 1700 are N-type, such as N-type silicon regions, as is depicted in FIG. 17.

Figure 18:
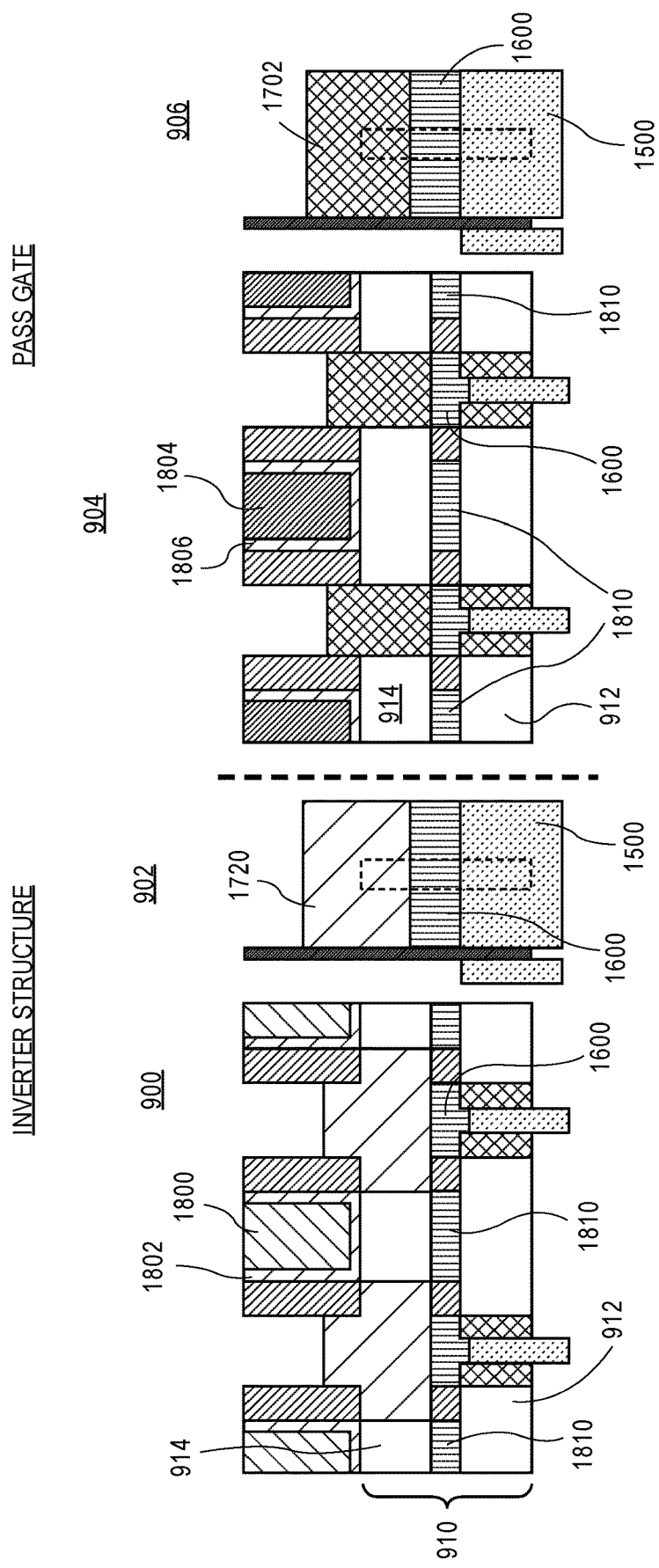

Referring to FIG. 18, a replacement gate process is then performed. For example, for the inverter structure, metal gate 1800 and high-k gate dielectric 1802 layers may be formed in place of the dummy gate structures 918. Likewise, for the pass gate structure, metal gate 1804 and high-k gate dielectric 1806 layers may be formed in place of the dummy gate structures 918.

In an embodiment, the replacement gate process is performed by forming an interlayer dielectric layer on the structure of FIG. 17. Such an interlayer dielectric layer may then be polished down to expose a polysilicon layer (dummy gate electrode 924) for removal. During this stage, remaining portions of the silicon germanium layer 916 are removed and replaced with an oxide fill material 1810, as is depicted in FIG. 18. The oxide fill material 1810 ultimately isolates bottom and top transistors. Subsequently, the lower transistor gate stack is formed within the trench formed upon removal of the dummy gate stack, which may involve deposition and recessing of gate materials to a level approximately at the level of the lower silicon layer 912, on either side of the semiconductor fin 910 (i.e., into and out of the page of the perspective shown in FIG. 18.)

A top transistor gate material stack may then be formed above the lower transistor gate material stack. In an embodiment, in the case of the inverter structure, the top transistor gate material stack is of an opposite conductivity type than that of the lower transistor gate material stack. In another embodiment, in the case of the pass gate structure, the top transistor gate material stack is of a same conductivity type as that of the lower transistor gate material stack. In either case, in an embodiment, within a same gate trench, an isolation layer is formed between the lower transistor gate material stack and the top transistor gate material stack. A portion of the top transistor gate stack is shown as 1800/1802 for the inverter structure and as 1804/1806 for the pass gate structure. It is to be appreciated that additional portions of the top transistor gate stack are also formed to a level approximately at the lower level of the upper silicon layer 914, on either side of the semiconductor fin 910 (i.e., into and out of the page of the perspective shown in FIG. 18.)

Figure 19:
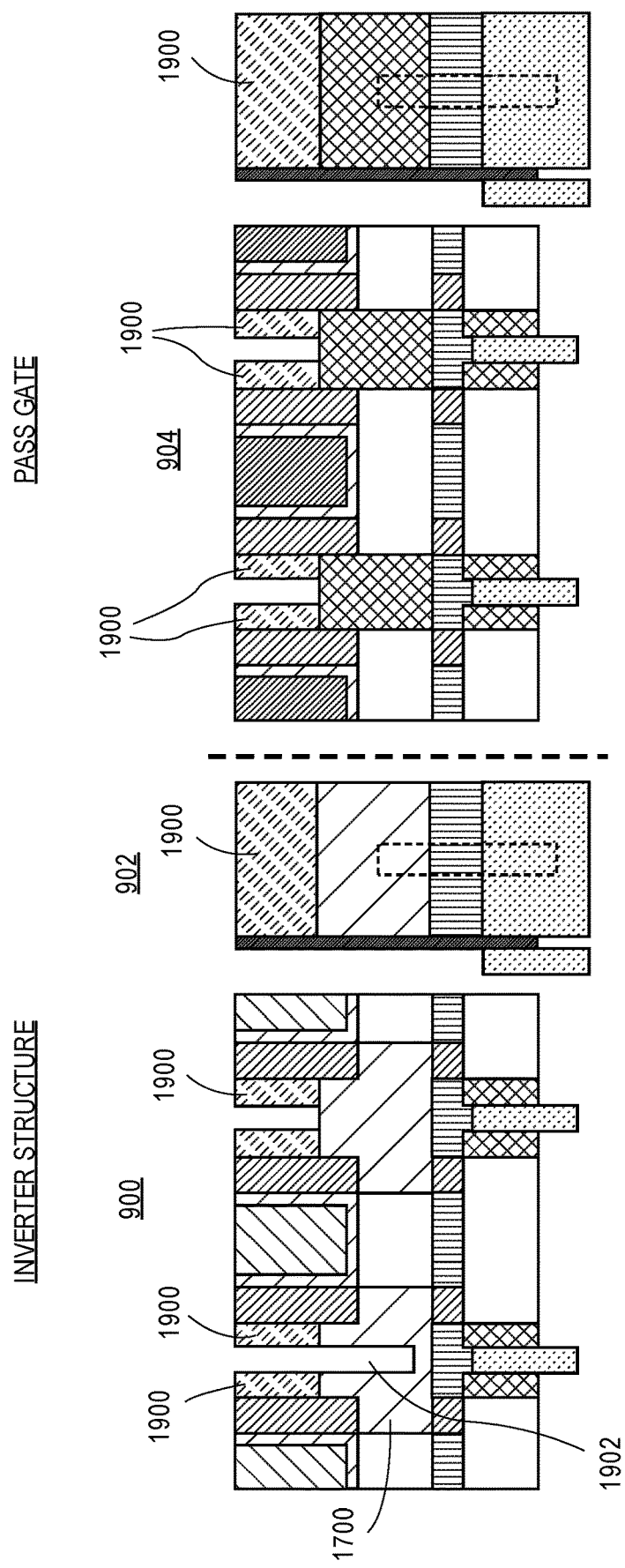

Referring to FIG. 19, a dielectric spacer 1900 is then formed. Dielectric spacer 1900 may be formed by first depositing a blanket film followed by contact lithography to open areas where top and bottom transistors are to be connected. A spacer dry etch may then be performed to form dielectric spacers 1900. Additionally, in select locations, epitaxial semiconductor dry etch (e.g., for one of the regions 1700) may then be performed to extend contact region 1902 where a top and bottom transistor are to be electrically connected.

Figure 20:
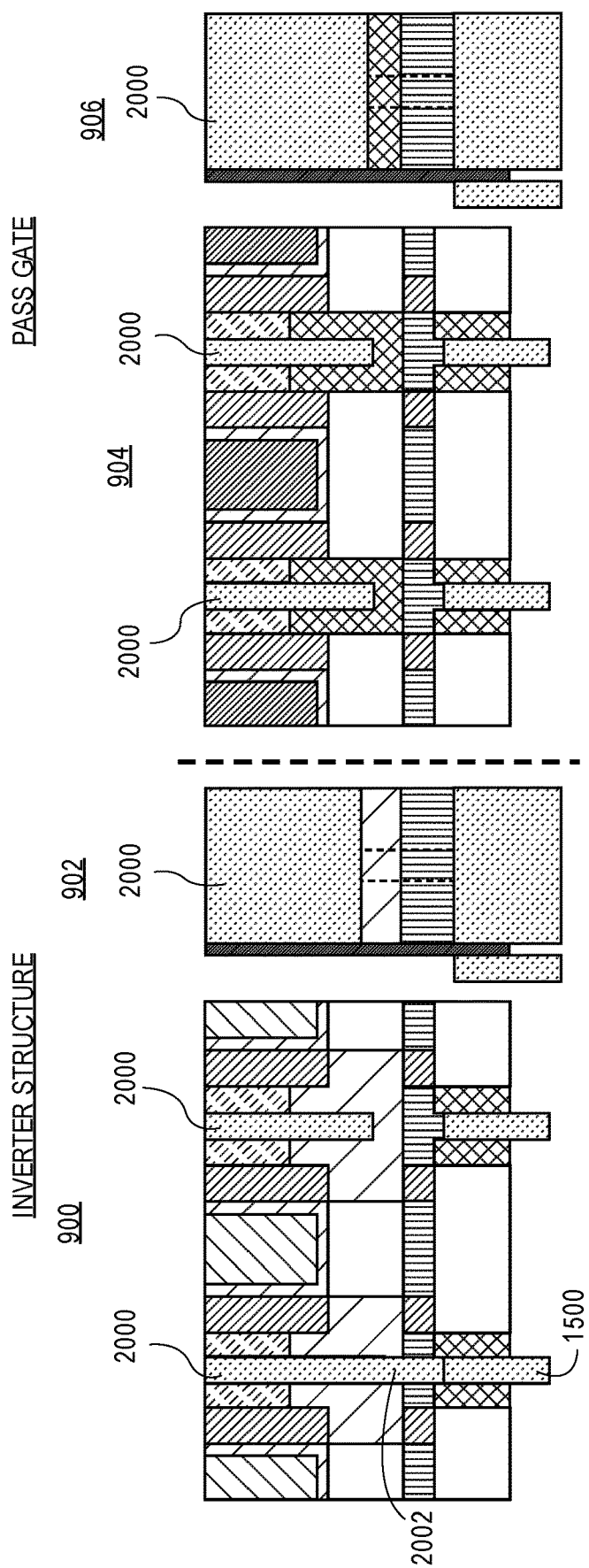

Referring to FIG. 20, upper contacts 2000 are then formed. In one embodiment, one contact 2002 of the upper contacts is electrically connected to one of the lower contacts 1500, as is the case for the inverter structure of FIG. 20. The upper contacts may be fabricated by stripping a photo-resist, followed by a blanket contact etch fabrication scheme to form required source/drain connections between top and bottom transistors.

Similarly, NAND gate fabrication using two fins can be formed by connecting two parallel PMOS on fin1 (e.g., FIGS. 6A and 6B) and two serial NMOS on fin2 (e.g., FIGS. 7A and 7B). It is to be appreciated that the parallel PMOS have separate source/drain with no connection between top and bottom transistors. In an embodiment, serial NMOS can be formed by one source/drain (either on left, or right) connected between top and bottom transistors and the other source/drain isolated between top and bottom.

In an embodiment, NOR gate architecture can be formed like NAND gate architecture by processing parallel NMOS transistors and serial PMOS transistors. Other elements of logic gates, or random logic and some elements of sequential logic can also be combined and made vertically on a single fin, using process steps mentioned above. Furthermore, combining this approach with routing tracks underneath the devices can yield complex gates in small areas. Additionally, total drive of the circuit elements can be increased by using multiple fins.

In an embodiment, a vertical architecture can alternatively be constructed using layer transfer technology, either at full device level or at the fin level. In addition, the semiconductor materials do not necessarily need to be Si, but can be any appropriate semiconducting material depending on the application. For example, FIGS. 21 and 22 are cross-sectional views representing various operations in a layer transfer technology that may be implemented to fabricate an initial base stack for a fin structure, in accordance with an embodiment of the present invention.

Figure 21:
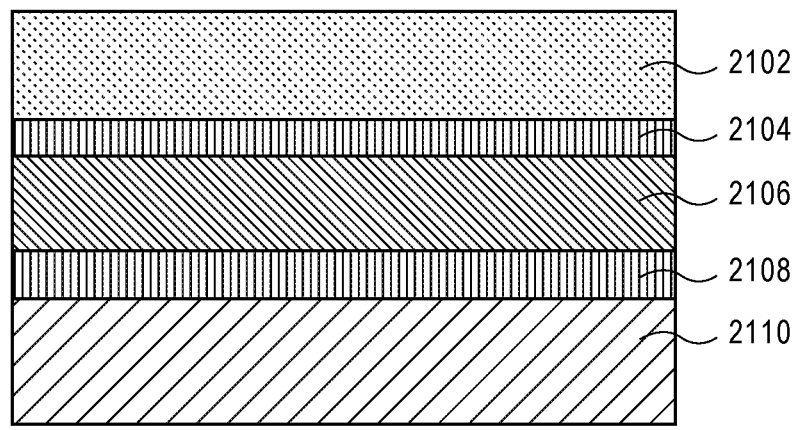
FIGS. 21 and 22 are cross-sectional views representing various operations in a layer transfer technology that may be implemented to fabricate an initial base stack for a fin structure, in accordance with an embodiment of the present invention.
Figure 22:
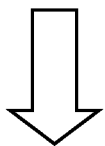
Figure 22:
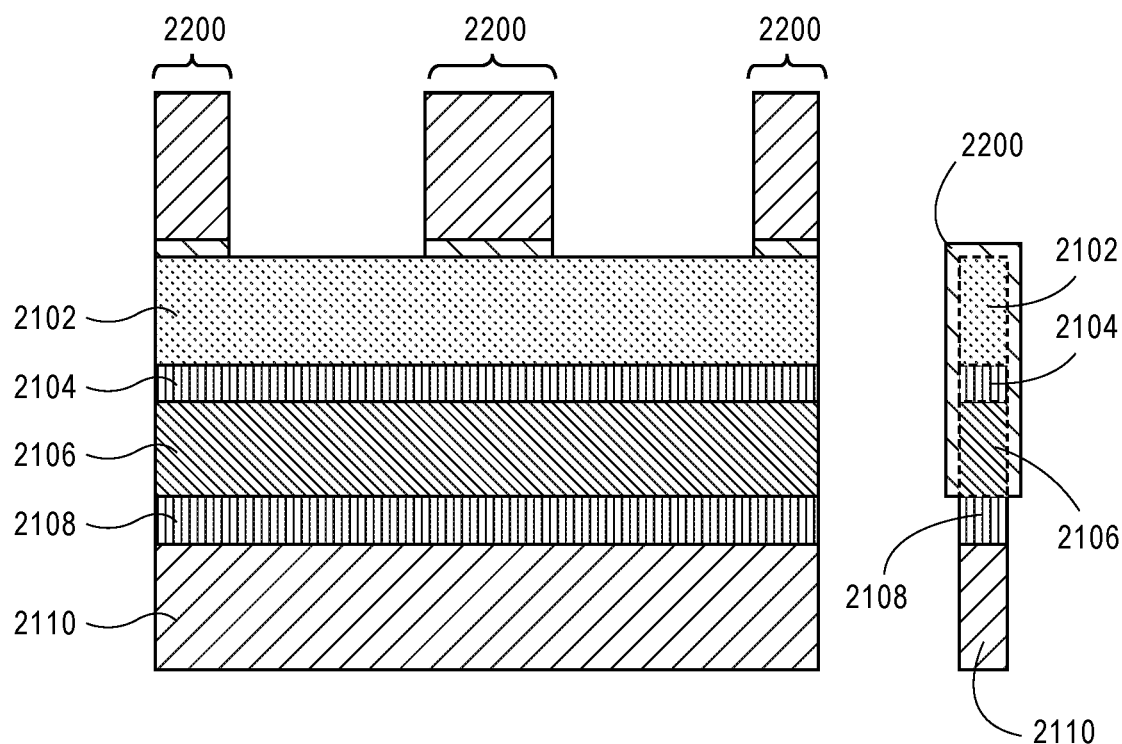

Referring to FIG. 21, a base stack 2100 includes a first semiconductor layer 2102, a first oxide layer 2104, a second semiconductor layer 2106 and a second oxide layer 2108, all formed on an underlying base wafer 2110. Referring to FIG. 22, following a fin etch (as shown in view 2202), a plurality of dummy gate structures 2200 may be fabricated and a process such as described above may be performed. In an embodiment, the base stack 2100 is generated by He/$H_2$ plus cleave based layer transfer or growth.

Figure 23:
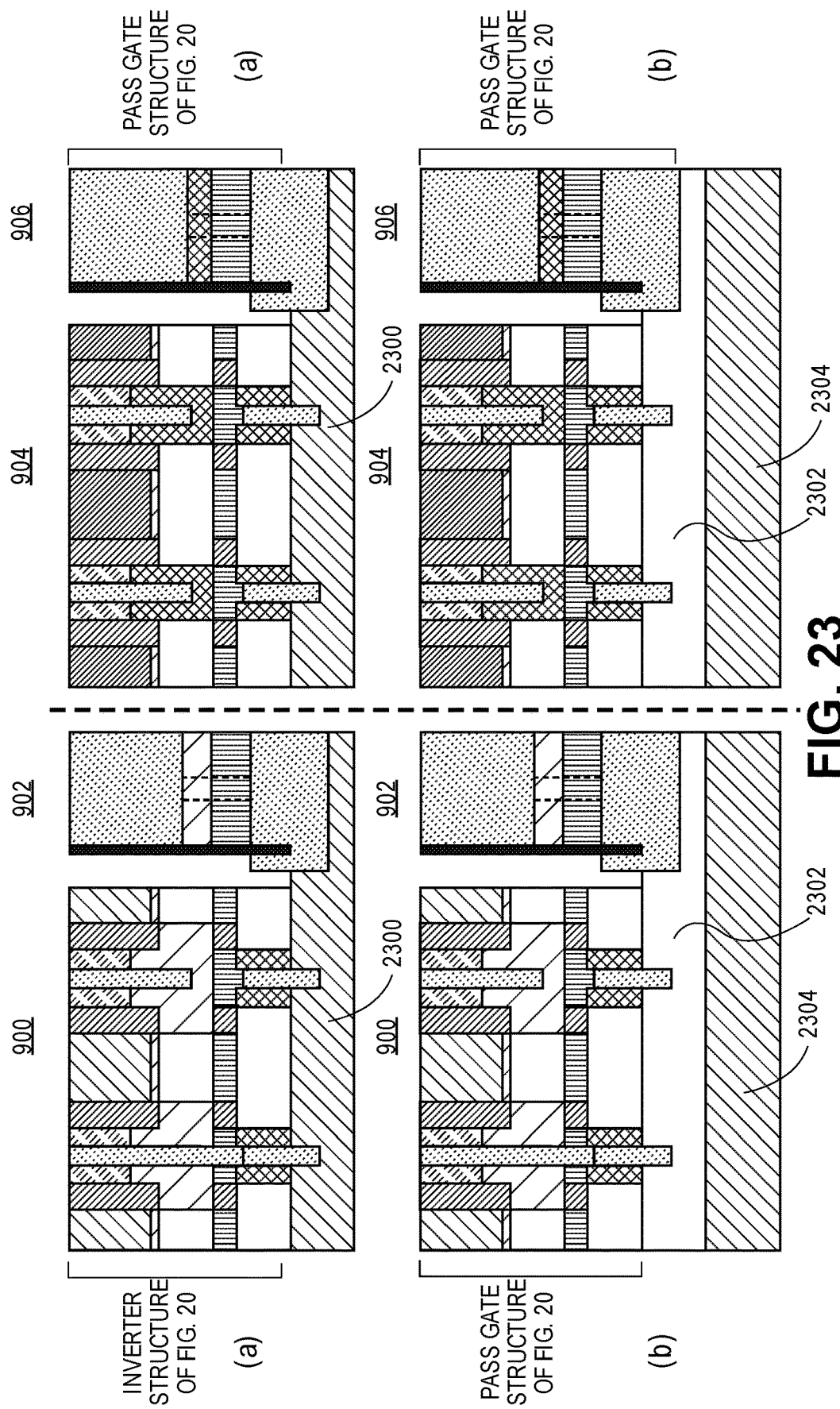
FIG. 23 illustrates cross-sectional views of finalized devices fabricated either on (a) a silicon substrate or (b) a buried oxide substrate, in accordance with an embodiment of the present invention.

FIG. 23 illustrates cross-sectional views of finalized devices fabricated either on (a) a silicon substrate or (b) a buried oxide substrate, in accordance with an embodiment of the present invention. Referring to part (a) of FIG. 23, the left-hand device represents the inverter structure of FIG. 20 formed on a silicon substrate 2300. The right-hand device represents the pass gate structure of FIG. 20 formed on a silicon substrate 2300. Referring to part (b) of FIG. 23, the left-hand device represents the inverter structure of FIG. 20 formed on a buried oxide layer 2302 formed between the device and a silicon substrate 2304. The right-hand device represents the pass gate structure of FIG. 20 formed on a buried oxide layer 2302 formed between the device and a silicon substrate 2304.

Figure 24:
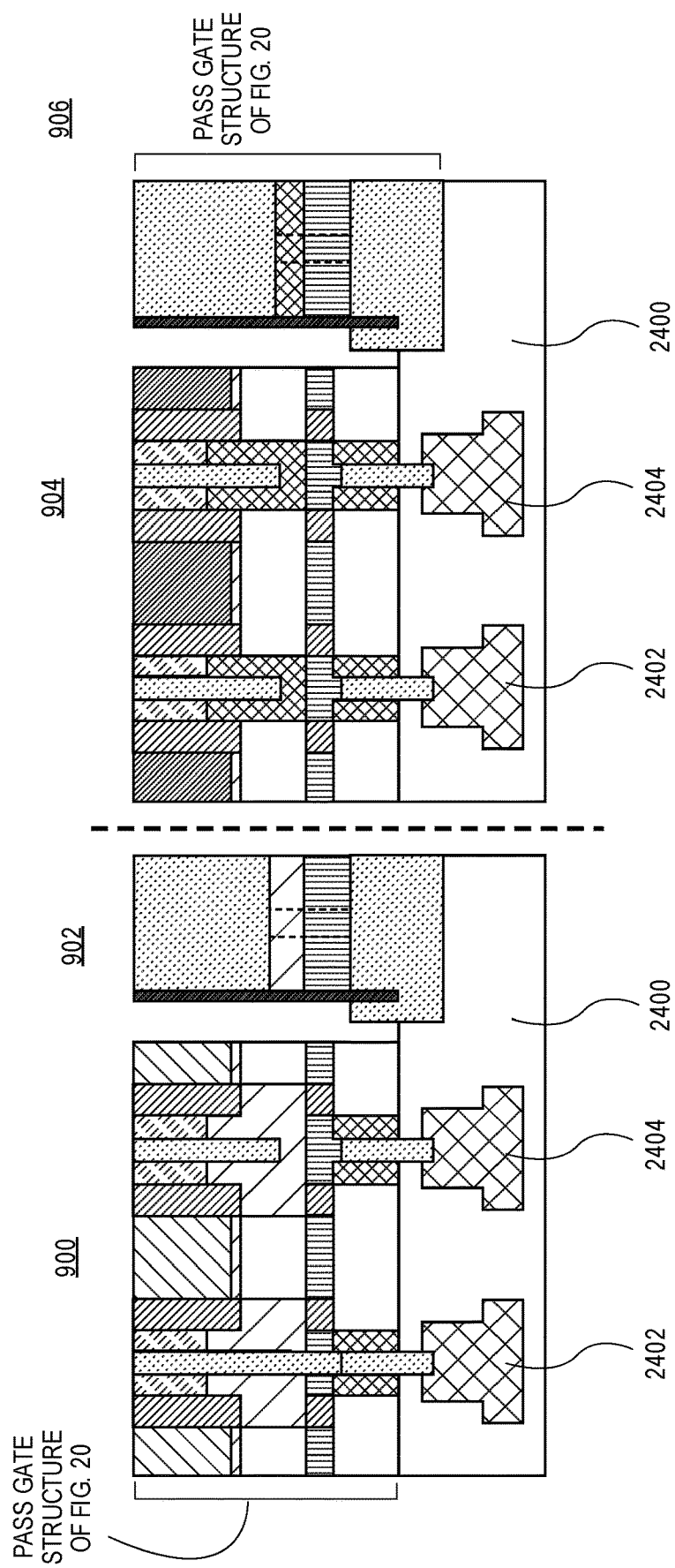
FIG. 24 illustrates cross-sectional views of finalized devices fabricated with underlying routing layers, in accordance with an embodiment of the present invention.

FIG. 24 illustrates cross-sectional views of finalized devices fabricated with underlying routing layers, in accordance with an embodiment of the present invention. Referring to the left-hand device of FIG. 24, the inverter structure of FIG. 20 is shown formed on a buried oxide layer 2400 with power lines 2402 and signal lines 2404 formed therein. Referring to the right-hand device of FIG. 24, the inverter structure of FIG. 20 is shown formed on a buried oxide layer 2400 with power lines 2402 and signal lines 2404 formed therein.

In other embodiments, exemplary process flows involve construction of interconnects on both sides of a device.

Flows could be one of, e.g., layer transfer after IC1 level fabrication, flip and grind flow, implant after device fabrication, implant prior to device fabrication. In an embodiment, such a process flow implies that power will be delivered from one side of the device stack, but this is not necessary if the packaging techniques can permit power delivery from both sides of the device.

Figure 25:
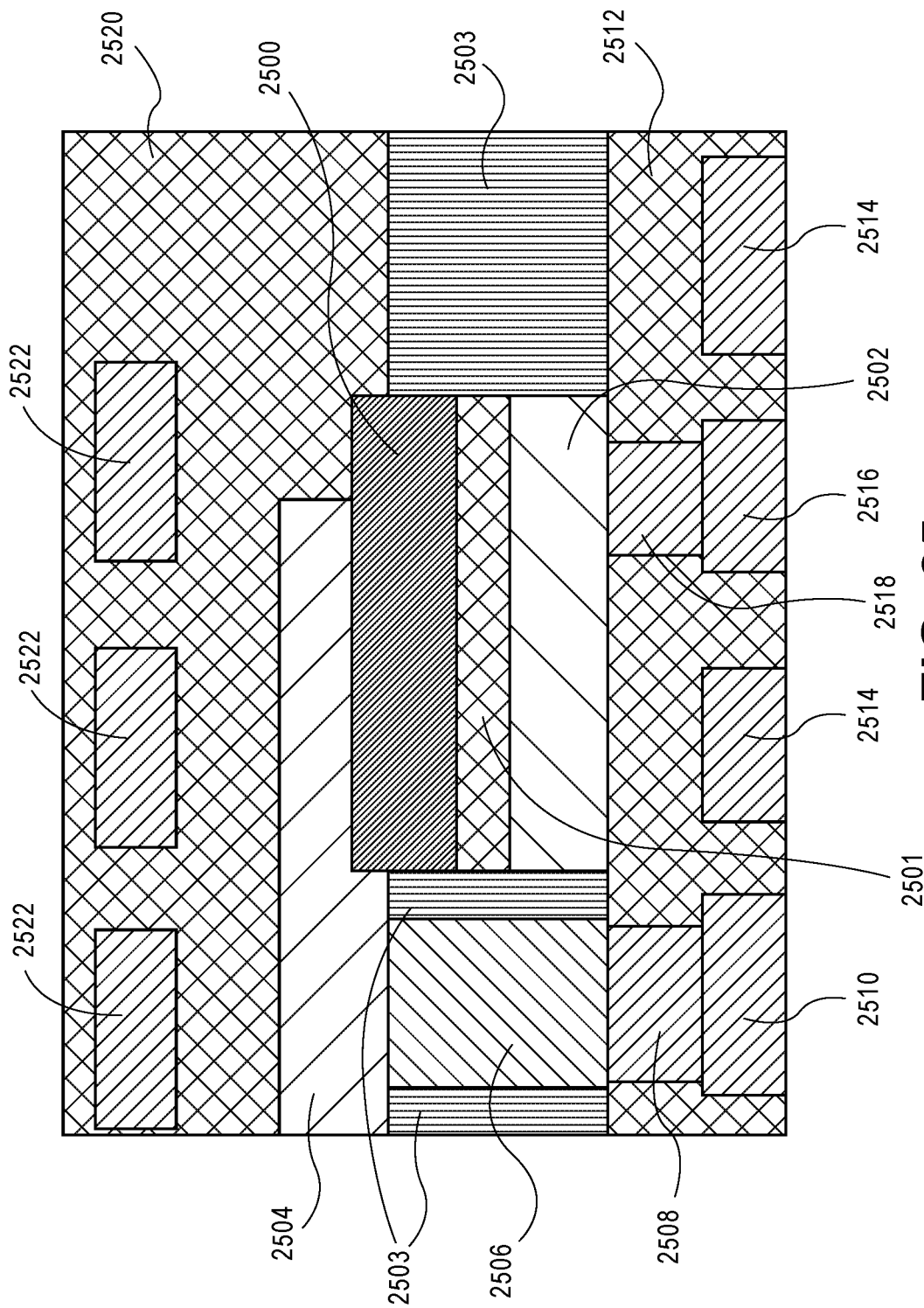
FIG. 25 illustrates an example of power being transferred from one side of a device to the opposite side, in accordance with an embodiment of the present invention.

In other embodiments, designs may require a via to connect from the backside to the front side either for delivering power or signal. In an example, FIG. 25 shows an example of power being transferred from one side of a device to the opposite side, in accordance with an embodiment of the present invention. Referring to FIG. 25, both the source/drain (S/D) and the gate may be connected to wiring either above or below the devices. In the specific example shown, a PMOS S/D 2500 and NMOS S/D 2502 are provided. The PMOS S/D 2500 and NMOS S/D 2502 are separated by dielectric 2501 and housed in oxide layer 2503. The PMOS S/D 2500 is coupled to metal line (Vcc) 2504 which is coupled to metal via (Vcc) 2506. Metal via 2506 is coupled to additional via 2508 and Vcc wiring 2510. Via 2508 and Vcc wiring 2510 are included in dielectric layer 2512. Also included in dielectric layer 2512 are VSS lines 2514 and signal line 2516 and via 2518 pairing. An upper dielectric layer 2520 includes signal lines 2522.

Figure 26:
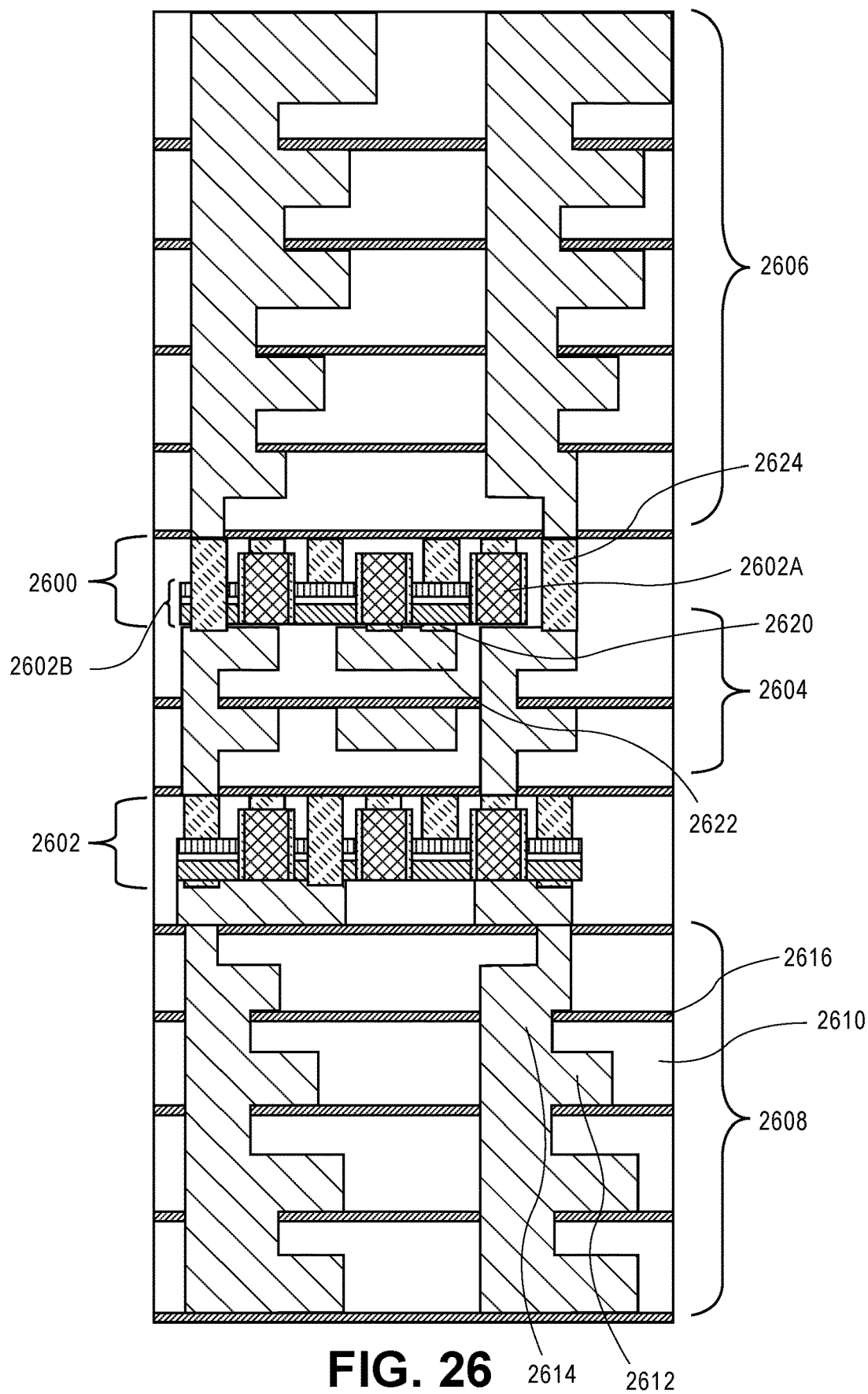
FIG. 26 illustrates a cross-sectional view of vertically integrated single fin elements having interconnect wiring between device layers, in accordance with an embodiment of the present invention.

In an embodiment, total chip area scaling can be further enhanced by integrating more than two transistors vertically either by extending the above technique, or using layer transfer techniques. In an example, FIG. 26 illustrates a cross-sectional view of vertically integrated single fin elements having interconnect wiring between device layers, in accordance with an embodiment of the present invention. Referring to FIG. 26, a first device layer 2600 and second device layer 2602 (e.g., with gates 2602A and fins 2602B) are vertical structures such as those described above such as described above. One or more metallization layers 2604 are between device layers, one or more metallization layers 2606 are above, and one or more metallization layers 2608 are below. Each metallization layer may include an interlayer dielectric (ILD) layer 2610, metal lines 2612, vias 2614 and an etch stop layer 2616. Particular routing may include contact 2620 to S/D, contact 2622 to gate, and backside to front side via 2624. In an embodiment, such an architecture can be fabricated using a layer transfer technique.

Figure 27:
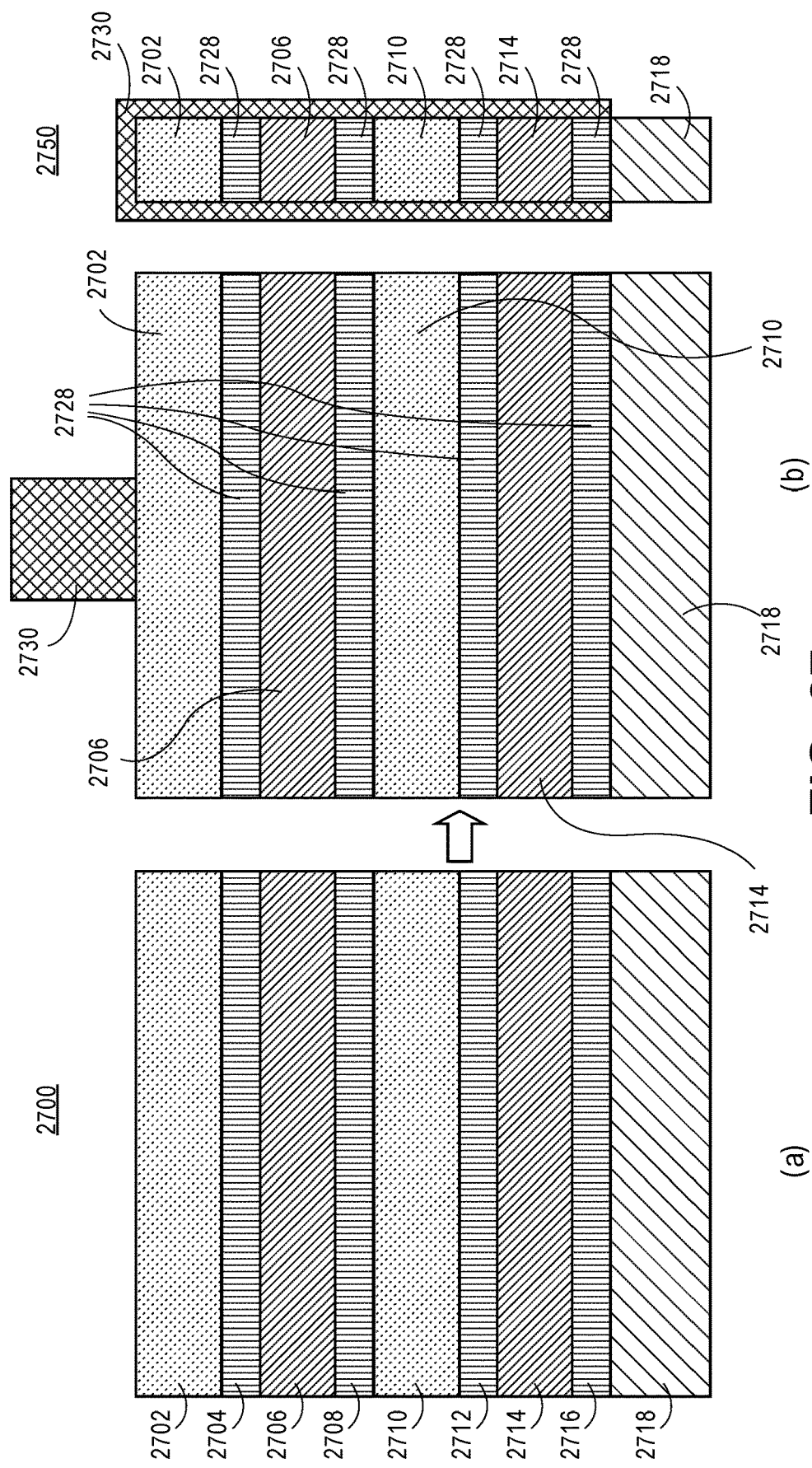
FIG. 27 illustrates an approach for extending the above principles to a four device structure technique, in accordance with an embodiment of the present invention.

FIG. 27 illustrates an approach for extending the above principles to a four device structure technique, in accordance with an embodiment of the present invention. Referring to part (a) of FIG. 27, a base stack 2700 includes a first silicon layer 2702, a first silicon germanium layer 2704, a second silicon layer 2706, a second silicon germanium layer 2708, a third silicon layer 2710, a third silicon germanium layer 2712, a fourth silicon layer 2714 and a fourth silicon germanium layer 2716 all formed on an underlying base wafer 2718. Referring to part (b) of FIG. 27, following a fin etch (as shown in view 2750), the silicon germanium layers 2704, 2708, 2712 and 2716 are replaced with an oxide material 2728, e.g., through a replacement gate process. Subsequently, a permanent gate structure 2730 may be fabricated. It is to be appreciated that the stack may be fabricated either by growing the stack (as described above) or using layer transfer to build the stack.

It is to be appreciated that the structures resulting from the above exemplary processing schemes may be used in a same or similar form for subsequent processing operations to complete circuit element fabrication. As an example of a completed device, FIGS. 28A and 28B illustrate a cross-sectional view and a plan view (taken along the a-a' axis of the cross-sectional view), respectively, of a non-planar semiconductor device having a vertical architecture and self-aligned gate edge isolation, in accordance with an embodiment of the present invention.

Figure 28A:
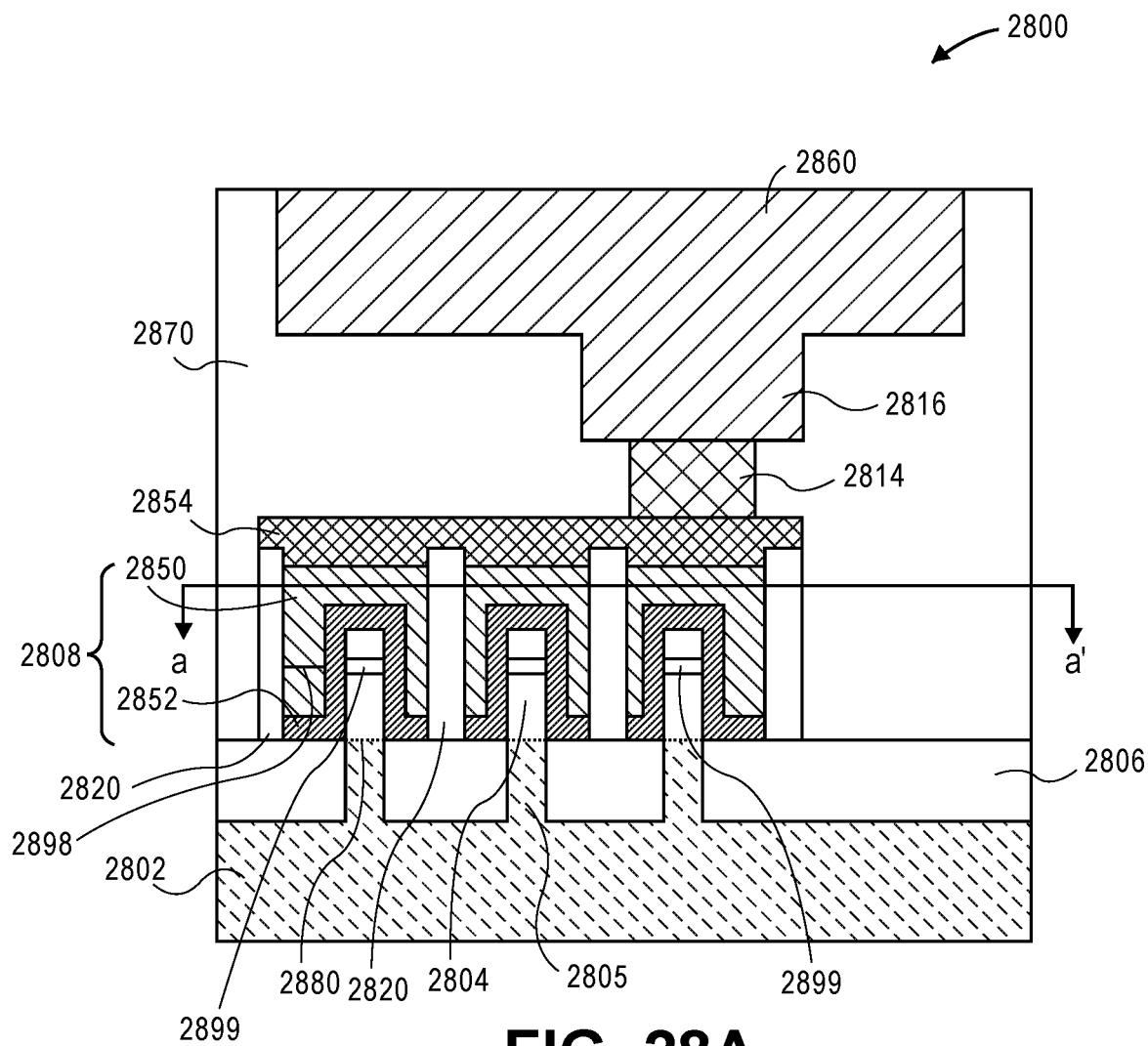
FIG. 28A illustrates a cross-sectional view of a non-planar semiconductor device having a vertical architecture and self-aligned gate edge isolation, in accordance with an embodiment of the present invention.

Referring to FIG. 28A, a semiconductor structure or device 2800 includes non-planar active regions (e.g., a fin structures including protruding fin portion 2804 and sub-fin region 2805) formed from substrate 2802, and within isolation region 2806. Gate structures 2808 are disposed over the protruding portions 2804 of the non-planar active regions as well as over a portion of the isolation region 2806. As shown, gate structures 2808 include a gate electrode 2850 and a gate dielectric layer 2852. In one embodiment, although not shown, gate structures 2808 may also include a dielectric cap layer. Gate structures 2808 are separated by self-aligned gate edge isolation structures 2820. A local interconnect 2854 couples adjacent gate structures 2808. A gate contact 2814, and overlying gate contact via 2816 are also seen from this perspective, along with an overlying metal interconnect 2860, all of which are disposed in interlayer dielectric stacks or layers 2870. Also seen from the perspective of FIG. 28A, the gate contact 2814 is, in one embodiment, disposed over the non-planar active regions. As is also depicted in FIG. 28A, an interface 2880 exists between a doping profile of protruding fin portions 2804 and sub-fin regions 2805, although other embodiments do not include such an interface in doping profile between these regions.

In an embodiment, referring again to FIG. 28A, the protruding fin portion 2804 is separated into upper and lower fin regions, e.g., by an oxide layer 2899. In an embodiment, referring again to FIG. 28A, the gate structures 2808 are separated into upper and lower gate structures, e.g., at level 2898, which may represent a P/N junction or an insulating layer disposed between upper and lower gate electrode regions.

Figure 28B:
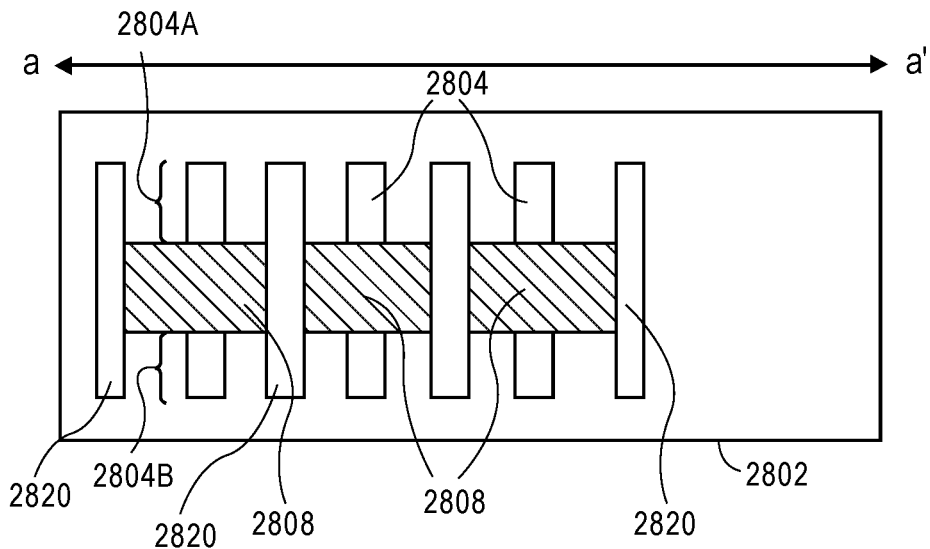
FIG. 28B illustrates a plan view taken along the a-a' axis of the semiconductor device of FIG. 28A, in accordance with an embodiment of the present invention.

Referring to FIG. 28B, the gate structures 2808 are shown as disposed over the protruding fin portions 2804, as isolated by self-aligned gate edge isolation structures 2820. Source and drain regions 2804A and 2804B of the protruding fin portions 2804 are shown in this perspective, although it is to be understood that these regions would be overlapped with trench contact structures. In one embodiment, the source and drain regions 2804A and 2804B are doped portions of original material of the protruding fin portions 2804. In another embodiment, the material of the protruding fin portions 2804 is removed and replaced with another semiconductor material, e.g., by epitaxial deposition. In either case, the source and drain regions 2804A and 2804B may extend below the height of dielectric layer 2806, i.e., into the sub-fin region 2805.

In an embodiment, the semiconductor structure or device 2800 is a non-planar device such as, but not limited to, a finFET or a tri-gate device. In such an embodiment, a corresponding semiconducting channel region is composed of or is formed in a three-dimensional body. In one such embodiment, the gate structures 2808 surround at least a top surface and a pair of sidewalls of the three-dimensional body.

Substrate 2802 may be composed of a semiconductor material that can withstand a manufacturing process and in which charge can migrate. In an embodiment, substrate 2802 is a bulk substrate composed of a crystalline silicon, silicon/germanium or germanium layer doped with a charge carrier, such as but not limited to phosphorus, arsenic, boron or a combination thereof, to form active region 2804. In one embodiment, the concentration of silicon atoms in bulk substrate 2802 is greater than 97%. In another embodiment, bulk substrate 2802 is composed of an epitaxial layer grown atop a distinct crystalline substrate, e.g. a silicon epitaxial layer grown atop a boron-doped bulk silicon mono-crystalline substrate. Bulk substrate 2802 may alternatively be composed of a group III-V material. In an embodiment, bulk substrate 2802 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 2802 is composed of a group III-V material and the charge-carrier dopant impurity atoms are ones such as, but not limited to, carbon, silicon, germanium, oxygen, sulfur, selenium or tellurium.

Isolation region 2806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 2806 is composed of a dielectric material such as, but not limited to, silicon dioxide, silicon oxy-nitride, silicon nitride, or carbon-doped silicon nitride.

Self-aligned gate edge isolation structures 2820 may be composed of a material suitable to ultimately electrically isolate, or contribute to the isolation of, portions of permanent gate structures from one another. For example, in one embodiment, the isolation region 2806 is composed of a dielectric material such as, but not limited to, silicon dioxide, silicon oxy-nitride, silicon nitride, or carbon-doped silicon nitride.

Gate structures 2808 may be composed of a gate electrode stack, and possible to vertically stacked gate stacks, which includes a gate dielectric layer 2852 and a gate electrode layer 2850. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 2802. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 2854, gate contact 2814, and overlying gate contact via 2816 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). It is to be appreciated that a hardmask layer may be disposed on the local interconnect 2854 in locations where gate contact 2814 is not located thereon. Furthermore, the local interconnect 2854 may be fabricated by lithographic patterning or, in other embodiments, may be fabricated as a self-aligned interconnect structure, as aligned with taller versions of a self-aligned gate edge isolation structures 2820.

In an embodiment (although not shown), providing structure 2800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 2808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 2800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 28A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

Figure 29:
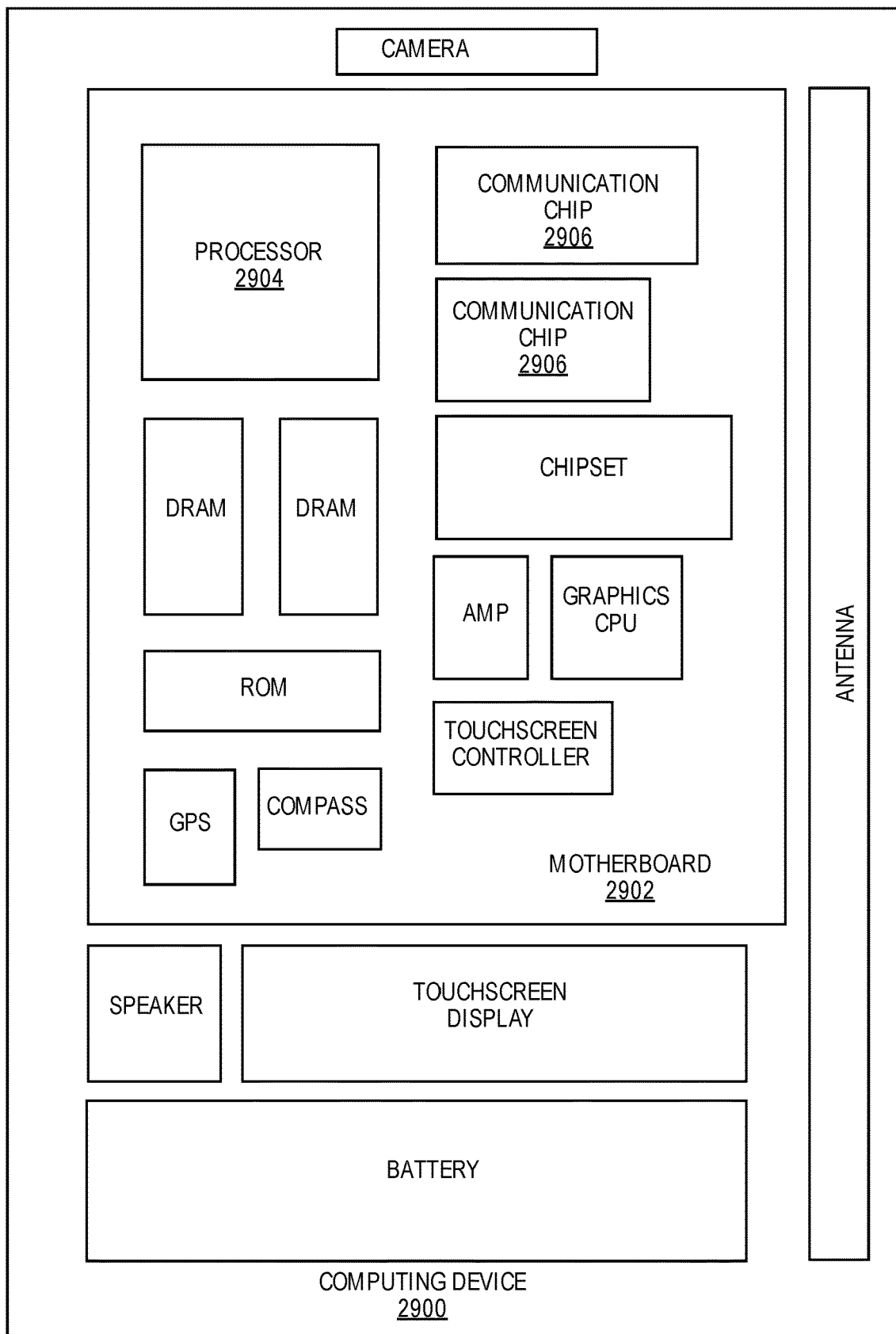
FIG. 29 illustrates a computing device in accordance with one implementation of the invention.

FIG. 29 illustrates a computing device 2900 in accordance with one implementation of the invention. The computing device 2900 houses a board 2902. The board 2902 may include a number of components, including but not limited to a processor 2904 and at least one communication chip 2906. The processor 2904 is physically and electrically coupled to the board 2902. In some implementations the at least one communication chip 2906 is also physically and electrically coupled to the board 2902. In further implementations, the communication chip 2906 is part of the processor 2904.

Depending on its applications, computing device 2900 may include other components that may or may not be physically and electrically coupled to the board 2902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 2906 enables wireless communications for the transfer of data to and from the computing device 2900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2900 may include a plurality of communication chips 2906. For instance, a first communication chip 2906 may be dedicated to shorter range wireless communications such as Wi-Fi and Bluetooth and a second communication chip 2906 may be dedicated to longer range wireless communications such as GPS, EDGE, GPRS, CDMA, WiMAX, LTE, Ev-DO, and others.

The processor 2904 of the computing device 2900 includes an integrated circuit die packaged within the processor 2904. In some implementations of the invention, the integrated circuit die of the processor includes one or more devices, such as MOS-FET transistors built in accordance with implementations of embodiments of the invention. The term "processor" may refer to any device or portion of a device that processes electronic data from registers and/or memory to transform that electronic data into other electronic data that may be stored in registers and/or memory.

The communication chip 2906 also includes an integrated circuit die packaged within the communication chip 2906. In accordance with another implementation of embodiments of the invention, the integrated circuit die of the communication chip includes one or more devices, such as MOS-FET transistors built in accordance with implementations of embodiments of the invention.

In further implementations, another component housed within the computing device 2900 may contain an integrated circuit die that includes one or more devices, such as MOS-FET transistors built in accordance with implementations of embodiments of the invention.

In various implementations, the computing device 2900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2900 may be any other electronic device that processes data.

Figure 30:
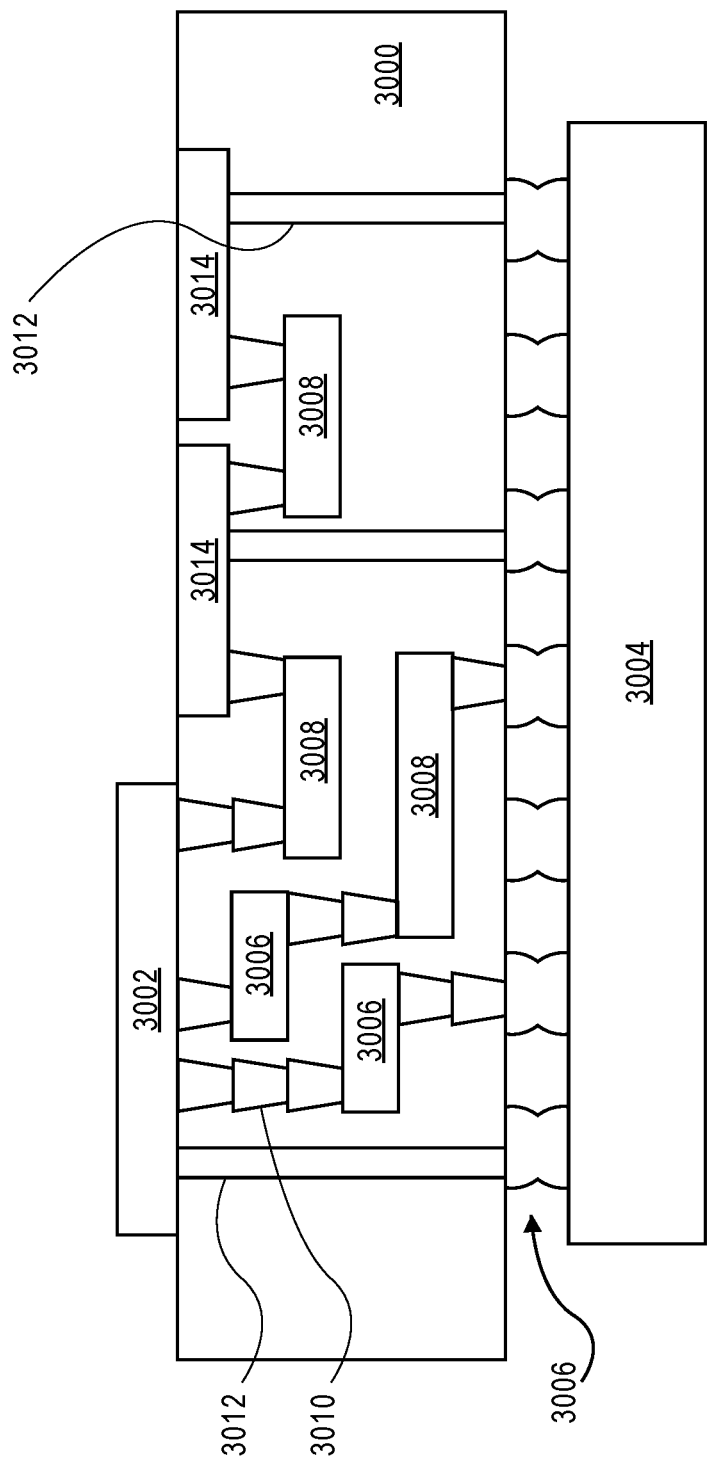
FIG. 30 is an interposer implementing one or more embodiments of the invention.

FIG. 30 illustrates an interposer 3000 that includes one or more embodiments of the invention. The interposer 3000 is an intervening substrate used to bridge a first substrate 3002 to a second substrate 3004. The first substrate 3002 may be, for instance, an integrated circuit die. The second substrate 3004 may be, for instance, a memory module, a computer motherboard, or another integrated circuit die. Generally, the purpose of an interposer 3000 is to spread a connection to a wider pitch or to reroute a connection to a different connection. For example, an interposer 3000 may couple an integrated circuit die to a ball grid array (BGA) 3006 that can subsequently be coupled to the second substrate 3004. In some embodiments, the first and second substrates 3002/3004 are attached to opposing sides of the interposer 3000. In other embodiments, the first and second substrates 3002/3004 are attached to the same side of the interposer 3000. And in further embodiments, three or more substrates are interconnected by way of the interposer 3000.

The interposer 3000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 3000 may include metal interconnects 3008 and vias 3010, including but not limited to through-silicon vias (TSVs) 3012. The interposer 3000 may further include embedded devices 3014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 3000. In accordance with embodiments of the invention, apparatuses or processes disclosed herein may be used in the fabrication of interposer 3000.

Thus, embodiments of the present invention include vertical integration schemes and circuit elements architectures for area scaling of semiconductor devices.

In an embodiment, an inverter structure includes a semiconductor fin separated vertically into an upper region and a lower region. A first plurality of gate structures is included for controlling the upper region of the semiconductor fin. A second plurality of gate structures is included for controlling the lower region of the semiconductor fin. The second plurality of gate structures has a conductivity type opposite the conductivity type of the first plurality of gate structures.

In one embodiment, the upper region of the fin and the lower region of the fin are separated by an insulating layer.

In one embodiment, corresponding ones of the first plurality of gate structures and the second plurality of gate structures are separated by an insulating layer.

In one embodiment, corresponding ones of the first plurality of gate structures and the second plurality of gate structures form a P/N junction.

In one embodiment, the first plurality of gate structures is a plurality of PMOS gate structures, and the second plurality of gate structures is a plurality of NMOS gate structures.

In one embodiment, the first plurality of gate structures is disposed over a top surface of the semiconductor fin and along sidewalls of the upper region of the semiconductor fin, and the second plurality of gate structures is disposed along sidewalls of the lower region of the semiconductor fin.

In one embodiment, the second plurality of gate structures is further disposed below a bottom surface of the semiconductor fin.

In an embodiment, a pass gate structure includes a semiconductor fin separated vertically into an upper region and a lower region. A first plurality of gate structures is included for controlling the upper region of the semiconductor fin. A second plurality of gate structures is included for controlling the lower region of the semiconductor fin. The second plurality of gate structures has a same conductivity type as the conductivity type of the first plurality of gate structures.

In one embodiment, the upper region of the fin and the lower region of the fin are separated by an insulating layer.

In one embodiment, corresponding ones of the first plurality of gate structures and the second plurality of gate structures are separated by an insulating layer.

In one embodiment, the first plurality of gate structures is a plurality of NMOS gate structures, and the second plurality of gate structures is a plurality of NMOS gate structures.

In one embodiment, the first plurality of gate structures is disposed over a top surface of the semiconductor fin and along sidewalls of the upper region of the semiconductor fin, and the second plurality of gate structures is disposed along sidewalls of the lower region of the semiconductor fin.

In one embodiment, the second plurality of gate structures is further disposed below a bottom surface of the semiconductor fin.

In an embodiment, a method of fabricating a circuit element on a single semiconductor fin includes forming a semiconductor fin. The method also includes separating the semiconductor fin vertically into an upper region and a lower region. The method also includes forming a lower plurality of gate structures for controlling the lower region of the semiconductor fin. The method also includes forming an upper plurality of gate structures for controlling the upper region of the semiconductor fin.

In one embodiment, forming the upper plurality of gate structures includes forming a plurality of gate structures having a conductivity type opposite the conductivity type of the lower plurality of gate structures.

In one embodiment, forming the upper plurality of gate structures includes forming a plurality of gate structures having a same conductivity type as the conductivity type of the lower plurality of gate structures.

In one embodiment, separating the semiconductor fin vertically into an upper region and a lower region includes forming an oxide layer between the upper region and the lower region of the semiconductor fin.

In one embodiment, forming an oxide layer between the upper region and the lower region of the semiconductor fin includes selectively removing a portion of a silicon germanium layer from between upper and lower silicon layers of the semiconductor fin.

In one embodiment, the method further includes forming first epitaxial source and drain regions for the lower portion of the semiconductor fin, and forming second epitaxial source and drain regions for the upper portion of the semiconductor fin, the second epitaxial source and drain regions of opposite conductivity type to the first epitaxial source and drain regions.

In one embodiment, the method further includes forming first epitaxial source and drain regions for the lower portion of the semiconductor fin, and forming second epitaxial source and drain regions for the upper portion of the semiconductor fin, the second epitaxial source and drain regions of a same conductivity type as the first epitaxial source and drain regions.

In one embodiment, forming the lower plurality of gate structures and forming the upper plurality of gate structures includes using a replacement gate process.

What is claimed is:

1. A computing device, comprising:
   a board; and
   a component coupled to the board, the component including an integrated circuit structure, comprising:
      an upper semiconductor body vertically over and isolated from a lower semiconductor body;
      a first gate structure for controlling the upper semiconductor body, the first gate structure having a first conductivity type; and
      a second gate structure for controlling the lower semiconductor body, the second gate structure having a second conductivity type, the second conductivity type of the second gate structure opposite the first conductivity type of the first gate structure, wherein the second gate structure is separate and distinct from the first gate structure.

2. The computing device of claim 1, further comprising:
   a memory coupled to the board.

3. The computing device of claim 1, further comprising:
   a communication chip coupled to the board.

4. The computing device of claim 1, further comprising:
   a camera coupled to the board.

5. The computing device of claim 1, further comprising:
   an antenna coupled to the board.

6. The computing device of claim 1, wherein the component is a packaged integrated circuit die.

7. The computing device of claim 1, wherein the component is selected from the group consisting of a processor, a communications chip, and a digital signal processor.

8. The computing device of claim 1, wherein the computing device is selected from the group consisting of a mobile phone, a laptop, a desk top computer, a server, and a set-top box.

9. A computing device, comprising:
   a board; and a component coupled to the board, the component including an integrated circuit structure, comprising:
an upper semiconductor body vertically over and isolated from a lower semiconductor body;
a first gate structure for controlling the upper semiconductor body, the first gate structure having a first conductivity type; and
a second gate structure for controlling the lower semiconductor body, the second gate structure having a second conductivity type, the second conductivity type of the second gate structure the same as the first conductivity type of the first gate structure, wherein the second gate structure is separate and distinct from the first gate structure.

10. The computing device of claim 9, further comprising: a memory coupled to the board.

11. The computing device of claim 9, further comprising: a communication chip coupled to the board.

12. The computing device of claim 9, wherein the component is a packaged integrated circuit die.

13. The computing device of claim 9, wherein the computing device is selected from the group consisting of a mobile phone, a laptop, a desk top computer, a server, and a set-top box.

14. A computing device, comprising:
a board; and
a component coupled to the board, the component including an integrated circuit structure, comprising:
a semiconductor fin separated vertically into an upper region and a lower region;
a first plurality of gate structures for controlling the upper region of the semiconductor fin; and
a second plurality of gate structures for controlling the lower region of the semiconductor fin, the second plurality of gate structures having a conductivity type opposite the conductivity type of the first plurality of gate structures, wherein the second plurality of gate structures is separate and distinct from the first plurality of gate structures.

15. The computing device of claim 14, further comprising: a memory coupled to the board.

16. The computing device of claim 14, further comprising: a communication chip coupled to the board.

17. The computing device of claim 14, wherein the component is a packaged integrated circuit die.

18. The computing device of claim 14, wherein the computing device is selected from the group consisting of a mobile phone, a laptop, a desk top computer, a server, and a set-top box.

19. A computing device, comprising:
a board; and
a component coupled to the board, the component including an integrated circuit structure, comprising:
a semiconductor fin separated vertically into an upper region and a lower region;
a first plurality of gate structures for controlling the upper region of the semiconductor fin; and
a second plurality of gate structures for controlling the lower region of the semiconductor fin, the second plurality of gate structures having a same conductivity type as the conductivity type of the first plurality of gate structures, wherein the second plurality of gate structures is separate and distinct from the first plurality of gate structures.

20. The computing device of claim 19, further comprising: a memory coupled to the board.

21. The computing device of claim 19, further comprising: a communication chip coupled to the board.

22. The computing device of claim 19, wherein the component is a packaged integrated circuit die.

23. The computing device of claim 19, wherein the computing device is selected from the group consisting of a mobile phone, a laptop, a desk top computer, a server, and a set-top box.

* * * * *